(12) United States Patent
Tsuda et al.

(10) Patent No.: US 6,765,233 B2
(45) Date of Patent: Jul. 20, 2004

(54) SEMICONDUCTOR SUBSTRATE, LIGHT EMITTING DEVICE, AND METHOD FOR PRODUCING THE SAME

(75) Inventors: Yuhzoh Tsuda, Tenri (JP); Shigetoshi Ito, Ikoma (JP); Seiki Yano, Yamatokoriyama (JP)

(73) Assignee: Sharp Kabushiki Kaisha, Abene-ku (JP)

( * ) Notice: Subject to any disclaimer, the term of this patent is extended or adjusted under 35 U.S.C. 154(b) by 0 days.

(21) Appl. No.: 09/904,162

(22) Filed: Jul. 11, 2001

(65) Prior Publication Data

US 2001/0039104 A1 Nov. 8, 2001

Related U.S. Application Data

(62) Division of application No. 09/289,575, filed on Apr. 9, 1999, now Pat. No. 6,294,440.

(30) Foreign Application Priority Data

| Apr. 10, 1998 | (JP) | .......................................... 10-098841 |
| Jun. 30, 1998 | (JP) | .......................................... 10-183468 |

(51) Int. Cl.[7] .............................................. H01L 27/15
(52) U.S. Cl. ....................................... 257/80; 257/103
(58) Field of Search .................. 257/80, 103; 438/496, 438/458, 481

(56) References Cited

U.S. PATENT DOCUMENTS 4,935,936 A  *  6/1990  Nelson et al. ................. 372/46
4,999,314 A  *  3/1991  Pribat et al. ................. 438/458
5,362,682 A  * 11/1994  Bozler et al. ................ 438/481
5,592,501 A  *  1/1997  Edmond et al. ............... 372/45

OTHER PUBLICATIONS

Usui et al Thick GaN Epitaxial Growth With Low Dislocation Density by Hyride Vapor Phase Density Jpn Journal of applied physics vol. 36 Part 2 No. 7B pp. L899–992.*
NN960875 Full Color Active Matrix Display Based on GaN Lateral Light Emitting Structures IMB Technical Disclosure Aug. 1996.*
Tanaka et al. (1997). "Reduced dislocation densities in selectivity–grown nitride materials" Ext. Abstract. (The 58th Autumn Meeting) *J. Soc. of Appl. Phys.* No. 1 265 2p–Q–14.

* cited by examiner

*Primary Examiner*—Erik J. Kielin
*Assistant Examiner*—David S. Blum
(74) *Attorney, Agent, or Firm*—Morrison & Foerster LLP

(57) ABSTRACT

A method for producing a semiconductor substrate of the present invention, includes the steps: forming a first patterned mask containing a material having a growth suppressing effect on a lower substrate; growing a semiconductor crystal on the lower substrate via the first patterned mask to form a first semiconductor crystal layer; forming a second patterned mask containing a material having a growth suppressing effect on or above the lower substrate, the second patterned mask at least having a surface which is positioned at a level different from a level of a surface of the first patterned mask, with respect to a surface of the lower substrate; and growing a semiconductor crystal on or above the lower substrate via the second patterned mask to form a second semiconductor crystal layer.

25 Claims, 12 Drawing Sheets

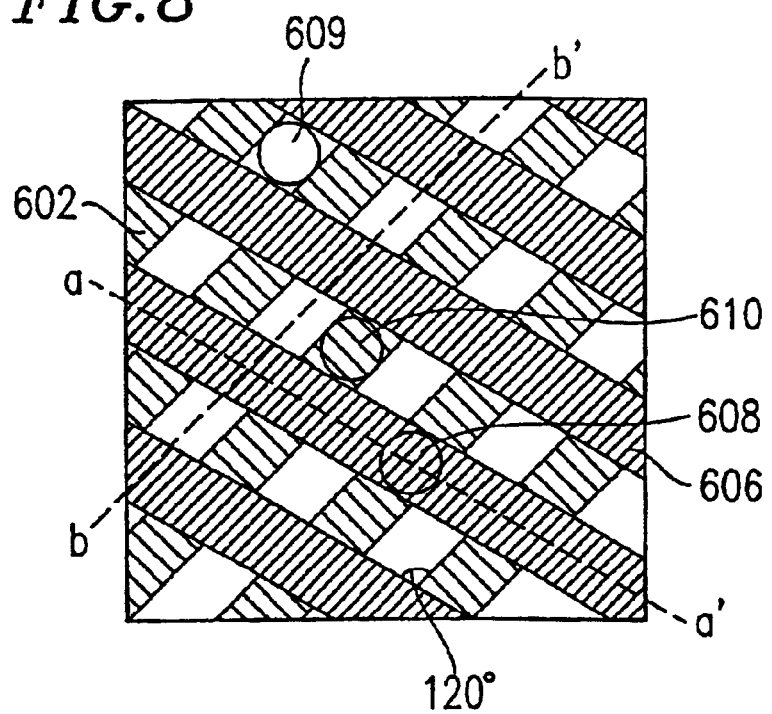

SEMICONDUCTOR SUBSTRATE, LIGHT EMITTING DEVICE, AND METHOD FOR PRODUCING THE SAME

CROSS-REFERENCE TO RELATED APPLICATIONS

This application is a division of U.S. patent application Ser. No. 09/289,575, filed Apr. 9, 1999 now U.S. Pat. No. 6,294,440, which claims priority to Japanese Patent Application Serial No. 10-098841, flied Apr. 10, 1998, and Japanese Patent Application Serial No. 10-183468, filed Jun. 30, 1998, the contents of which are incorporated herein by reference in their entirety.

BACKGROUND OF THE INVENTION

1. Field of the Invention

The present invention relates to a method for growing, on a lower substrate, a crystal of high quality having a lattice constant different from that of a lower substrate, and a semiconductor substrate obtained by such a method. The present invention further relates to a method for growing a crystal to obtain a highly reliable device with high performance by producing a light-emitting element and an electronic element on a semiconductor substrate, and a device obtained by such a method. In particular, the present invention relates to a method for growing a crystal preferably used for producing a gallium nitride (GaN) type blue light emitting element having a high efficiency and high reliability and a light-emitting element obtained by such a method.

2. Description of the Related Art

An optoelectronic integrated circuit (OEIC) is a device which is capable of processing a large amount of information at a high speed by integrating an optical element and an Si-type LSI on the same substrate. The OEIC is expected as an indispensable device in an advanced information society and has been studied for such a reason.

In the field of an Si-type LSI, SOI, SIMOX, and the like are suggested as an ultra-fast next generation integrated circuits with low power consumption, and there is an increasing demand for technical development of SOI, SIMOX, and the like.

The main purpose in the field of an optical element is to develop a technique of producing an AlGaAs laser structure on an Si substrate. However, a difference in a lattice constant and a difference in a coefficient of thermal expansion between an AlGaAs crystal and an Si crystal of a substrate is large, thereby making it very difficult to grow an AlGaAs crystal having good crystallinity on an Si substrate. In realizing such a semiconductor device, characteristics of an underlying crystal layer for producing a device and a substrate are important.

In particular, a gallium nitride (GaN) type semiconductor is applied to a short-wavelength light-emitting element (blue light emitting element) and an electronic element which operates at a high temperature and a high speed. In production of such a GaN type semiconductor device, a substrate made of a material (e.g., sapphire and SiC) which is different from a GaN type semiconductor is used as a substitute substrate. Basically, it is desirable to use a substrate made of GaN for a substrate on which a GaN type semiconductor crystal is grown. However, a GaN type semiconductor has a large decompression pressure, so that a large-scale bulk crystal made of a GaN type semiconductor cannot be produced; thus, such a substitute substrate is used.

In the case of using a substitute substrate as described above, a difference in a lattice constant or a difference in a coefficient of thermal expansion between a crystal of a substrate material and a GaN type semiconductor crystal is large, so that it is difficult to epitaxially grow a crystal having good crystallinity and having a small crystal defect or a crystal dislocation density on the substitute substrate. For example, in the case of using a sapphire substrate as a substitute substrate for growing a GaN semiconductor crystal, it is known that there will be a threading dislocation of about $10^9$ to $10^{10}/cm^2$ in the GaN semiconductor crystal layer grown on the sapphire substrate. Furthermore, in the case where the thickness of the GaN semiconductor crystal layer exceeds about 10 μm, crystal cracks and lattice strains in the GaN semiconductor crystal layer become large.

In order to overcome the above-mentioned problems, for example, the following two methods for growing a crystal are suggested. As the first conventional example, a method for growing a crystal in Extended Abstracts 2p-Q-14, No. 1 (1997), p. 265 (The 58th Meeting, 1997); The Japan Society of Applied Physics will be described. Referring to FIG. 14, according to this method, an $SiO_2$ pattern 901, with openings 902, is formed on a sapphire substrate 900, and then, a GaN single crystal film 903 is grown by a metal organic chemical vapor deposition (MOCVD) method, using the $SiO_2$ pattern 901 as a mask. In the first conventional example, the growth of the GaN single crystal starts from the opening 902, not from a portion covered with the $SiO_2$ pattern 901 of the sapphire substrate 900. Thus, strains, which are caused by a difference in a lattice constant and/or a difference in a coefficient of thermal expansion and which may cause threading dislocation, can be prevented from being generated in the vicinity of an interface between the sapphire substrate 900 and the GaN single crystal film 903. According to this method, the $SiO_2$ pattern is effective for allowing a GaN crystal to be selectively grown (i.e., an effect of suppressing the growth of a crystal defect), so that a defect density is measured (about $10^5$ to about $10^6/cm^2$) only in a GaN single crystal 904 above the $SiO_2$ pattern 901 in the GaN single crystal film 903. According to this method, a value of a defect density is decreased by 4 orders of magnitude, compared with a GaN single crystal in the case where a GaN signal crystal film is directly grown on a sapphire substrate.

Furthermore, a method for growing a crystal in Extended Abstracts 2p-Q-14, No. 1 (1997), p. 266 (The 58th Meeting, 1997); The Japan Society of Applied Physics will be described. Referring to FIG. 15, according to this method, a GaN single crystal film 911 is grown on a sapphire substrate 910 by an MOCVD method, an $SiO_2$ pattern 912 with openings 913 is formed on the GaN single crystal film 911, and a GaN single crystal film 914 is grown by an HVPE (hydride vapor phase epitaxy) method, using the $SiO_2$ pattern 912 as a mask. According to this method, a value of a defect density of the GaN single crystal film 914 can be decreased for the same reason as that of the first conventional example. A defect density in the vicinity of the surface of the GaN single crystal film 914 is measured to be about $6 \times 10^7/cm^2$. According to this method, a value of a defect density is decreased by three orders of magnitude, compared with a GaN single crystal in the case where a GaN single crystal film is grown directly on a sapphire substrate without using an $SiO_2$ pattern.

A semiconductor substrate having as its surface a GaN single crystal film produced by one of the above-mentioned first and second conventional methods is used as a substrate for growing a GaN type semiconductor device, whereby it is expected to realize an electronic device with higher performance.

However, a semiconductor substrate having as its surface a GaN single crystal film obtained by using one of the above-mentioned first and second conventional methods is not sufficient for obtaining a highly reliable semiconductor laser or an LED, or electronic elements such as an FET. For example, in order to enhance a life-span of a product in a semiconductor laser device, a defect density in the vicinity of a light-emitting region is required to be about $10^5/cm^2$ or less, and a defect density is desired to be equal to or lower than the order of $10^4/cm^2$ of another III–V group (e.g., GaAs, etc.) semiconductor substrate.

A GaN single crystal layer produced by the first and second conventional methods has a defect density of about $10^5$ to about $10^7/cm^2$, and therefore, does not satisfy the above-mentioned condition. A light-emitting element produced on a GaN single crystal layer having lattice strains and a number of crystal defects has lower reliability. For example, a semiconductor laser device produced on such a GaN single crystal layer is confirmed to have a life-span of only about 900 hours at a continuous oscillation under the condition of room temperature and an output of 3 mW.

According to the first conventional method, a high quality GaN crystal having a reduced defect density is limited to that grown in a region above an $SiO_2$ pattern. A crystal grown in the other region has quality equal to that of a crystal according to the conventional method without using an $SiO_2$ pattern. To use a semiconductor substrate including a GaN crystal layer having a locally reduced defect density as a substrate for growing a crystal is not practical for the reason of a limited degree of freedom of a device design.

According to the second conventional method, since an HVPE method is used, a crystal layer which is relatively thick (about several 10 $\mu$m) for an epitaxial growth film can be obtained. The effect of the $SiO_2$ pattern is relaxed in the vicinity of the surface of the GaN crystal layer by increasing the thickness of the crystal layer, so that defects will be uniformly distributed in the entire surface. Accordingly, the problem that crystal quality of the GaN crystal layer is locally improved as in the first conventional example can be solved. However, in terms of the defect density, the second conventional example is inferior to the first conventional example.

In addition, according to the first and second conventional methods, a GaN single crystal layer is produced by using an $SiO_2$ pattern in the shape of a stripe. Thus, lattice strains are decreased in a direction vertical to the stripe of the $SiO_2$ pattern; however, lattice strains in a plane parallel to the stripe remain substantially equal to that of a crystal according to the conventional method without using an $SiO_2$ pattern. When a GaN type semiconductor layer is grown on a GaN crystal layer in which lattice strains having a particular directivity are introduced, lattice strains having anisotropy are propagated to the GaN type semiconductor layer.

Alternatively, it is also possible to grow a thicker GaN crystal layer (about 50 $\mu$m) on a sapphire substrate, and remove the sapphire substrate from the reverse surface of the GaN crystal layer, thereby obtaining a GaN substrate. However, crystal defects (more than on the order of $10^5/cm^2$) remain even in the GaN substrate thus obtained, and lattice strains having anisotropy cannot be relaxed.

SUMMARY OF THE INVENTION

A method for producing a semiconductor substrate of the present invention, includes the steps: forming a first patterned mask containing a material having a growth suppressing effect on a lower substrate; growing a semiconductor crystal on the lower substrate via the first patterned mask to form a first semiconductor crystal layer; forming a second patterned mask containing a material having a growth suppressing effect on or above the lower substrate, the second patterned mask at least having a surface which is positioned at a level different from a level of a surface of the first patterned mask, with respect to a surface of the lower substrate; and growing a semiconductor crystal on or above the lower substrate via the second patterned mask to form a second semiconductor crystal layer.

In one embodiment of the present invention, the second patterned mask is positioned on the first semiconductor crystal layer.

In another embodiment of the present invention, the first and second patterned masks are patterned in such a manner that a combination of the first and second patterned masks covers the entire surface of the lower substrate, and an area of the lower substrate covered with the second patterned mask is larger than an area of the lower substrate covered with the first patterned mask.

In another embodiment of the present invention, the second patterned mask includes a first portion and a second portion, the first and second portions have different widths in a direction vertical to the surface of the lower substrate, and the step of forming the first semiconductor crystal layer and the step of forming the second semiconductor crystal layer are conducted during the same crystal growth step.

In another embodiment of the present invention, the first portion of the second patterned mask is at least partially positioned on the first patterned mask, and the second patterned mask has an L-shape.

In another embodiment of the present invention, the first portion of the second patterned mask is at least partially positioned on the lower substrate, and the second patterned mask has a T-shape.

In another embodiment of the present invention, a growth direction of the second semiconductor crystal layer is at least partially different from a growth direction of the first semiconductor crystal layer.

In another embodiment of the present invention, the first semiconductor crystal layer is formed in the vicinity of openings in the first patterned mask, whereby the first semiconductor crystal layer has openings on the lower substrate and the first patterned mask.

In another embodiment of the present invention, the lower substrate includes a sapphire substrate and a lower semiconductor crystal layer provided on an upper side of the sapphire substrate in a crystal growth direction.

In another embodiment of the present invention, the material having a growth suppressing effect is selected from the group consisting of $SiO_2$ and $SiN_x$, and the first and second patterned masks are independently selected from the group consisting of $SiO_2$ and $SiN_x$.

In another embodiment of the present invention, the first and second semiconductor crystal layers are selected from the group consisting of GaN, InGaN, and AlGaN.

A semiconductor substrate of the present invention, includes: a first patterned mask containing a material having a growth suppressing effect, provided on a lower substrate; a first semiconductor crystal layer grown on the lower substrate via the first patterned mask; a second patterned mask containing a material having a growth suppressing effect, provided on or above the lower substrate, at least having a surface which is positioned at a level different from a level of a surface of the first patterned mask, with respect to a surface of the lower substrate; and a second semiconductor crystal layer grown on or above the lower substrate via the second patterned mask.

A method for producing a semiconductor substrate of the present invention, includes the steps of: forming an n-th patterned mask containing a material having a growth suppressing effect on or above a lower substrate, wherein n is an integer of 1 or more; growing a nitride semiconductor crystal on or above the lower substrate via the n-th patterned mask to form an n-th nitride semiconductor crystal layer; forming an (n+1)-th patterned mask containing a material having a growth suppressing effect on or above the lower substrate, the (n+1)-th patterned mask at least having a surface which is positioned at a level different from a level of a surface of the n-th patterned mask, with respect to a surface of the lower substrate; and growing a nitride semiconductor crystal on or above the lower substrate via the (n+1)-th patterned mask to form an (n+1)-th nitride semiconductor crystal layer.

In one embodiment of the present invention, the first to (n+1)-th patterned masks are patterned in such a manner that a combination of the first to (n+1)-th patterned masks covers the entire surface of the lower substrate.

In another embodiment of the present invention, the n-th patterned mask and the (n+1)-th patterned mask are respectively patterned in a stripe shape, and a direction of the stripe of the n-th patterned mask is twisted from a direction of the stripe of the (n+1)-th patterned mask.

In another embodiment of the present invention, the direction of the stripe of the n-th patterned mask and the direction of the stripe of the (n+1)-th patterned mask have an angle difference of about 120°.

In another embodiment of the present invention, the direction of the stripe of the n-th patterned mask and the direction of the stripe of the (n+1)-th patterned mask have an angle difference of about 90°.

In another embodiment of the present invention, a width of the stripe of the (n+1)-th patterned mask is equal to or larger than a width of the stripe of the n-th patterned mask.

In another embodiment of the present invention, the material having a growth suppressing effect is made of $SiO_2$ or $SiN_x$, and the first to (n+1)-th patterned masks are independently made of $SiO_2$ or $SiN_x$.

In another embodiment of the present invention, the lower substrate includes at least a lower nitride semiconductor crystal layer provided on an upper surface of the lower substrate, and a direction of the stripe of the n-th patterned mask is equal to a <1-100> direction or a <11-20> direction of a crystal of the nitride semiconductor crystal layer.

In another embodiment of the present invention, the lower substrate includes at least a lower nitride semiconductor crystal layer provided on an upper side of the lower substrate in a crystal growth direction, the semiconductor substrate includes the first, second and third nitride semiconductor crystal layers, and a combination of directions of the first, second and third patterned masks consists of a combination of [1-100], [10-10], and [01-10] directions of a crystal of the nitride semiconductor crystal.

In another embodiment of the present invention, the n-th nitride semiconductor crystal layer is made of $Al_xIn_yGa_zN$ (where $x+y+z=1$, $0 \leq x \leq 1$, $0 \leq y \leq 1$, and $0 \leq z \leq 1$).

In another embodiment of the present invention, the n-th nitride semiconductor crystal layer or the (n+1)-th nitride semiconductor crystal layer has a thickness of about 5 μm or more.

In another embodiment of the present invention, the lower substrate includes a substrate body and a lower nitride semiconductor crystal layer provided on an upper side of the substrate body in a crystal growth direction, the method further including the step of removing at least the substrate body from a crystal structure including the (n+1)-th nitride semiconductor crystal layer after the step of forming the (n+1)-th nitride semiconductor crystal layer.

A semiconductor substrate of the present invention, includes: an n-th patterned mask containing a material having a growth suppressing effect provided on or above a lower substrate, wherein n is an integer of 1 or more; an n-th nitride semiconductor crystal layer grown on or above the lower substrate via the n-th mask; an (n+1)-th patterned mask containing a material having a growth suppressing material provided on or above the lower substrate, the (n+1)-th mask at least having a surface which is positioned at a level different from a level of a surface of the n-th mask, with respect to a surface of the lower substrate; and an (n+1)-th nitride semiconductor crystal layer grown on or above the lower substrate via the (n+1)-th patterned mask.

A light-emitting device produced by using the above-mentioned semiconductor substrate is provided.

Thus, the invention described herein makes possible the advantages of (1) providing a semiconductor substrate including a nitride semiconductor crystal layer with a crystal defect density and a threading dislocation surface density sufficiently reduced, and a method for producing the same; (2) providing a semiconductor substrate including a nitride semiconductor crystal layer with no lattice strains having anisotropy introduced thereto, and a method for producing the same; and (3) providing a highly reliable semiconductor device with high performance, using a semiconductor substrate including a nitride semiconductor crystal layer with improved crystallinity as a substrate for growth, and a method for producing the same.

These and other advantages of the present invention will become apparent to those skilled in the art upon reading and understanding the following detailed description with reference to the accompanying figures.

BRIEF DESCRIPTION OF THE DRAWINGS

FIG. 8 is a view illustrating the steps of producing the semiconductor substrates in Embodiments 7 and 8 of the present invention.

DESCRIPTION OF THE PREFERRED EMBODIMENTS

Figure 1:
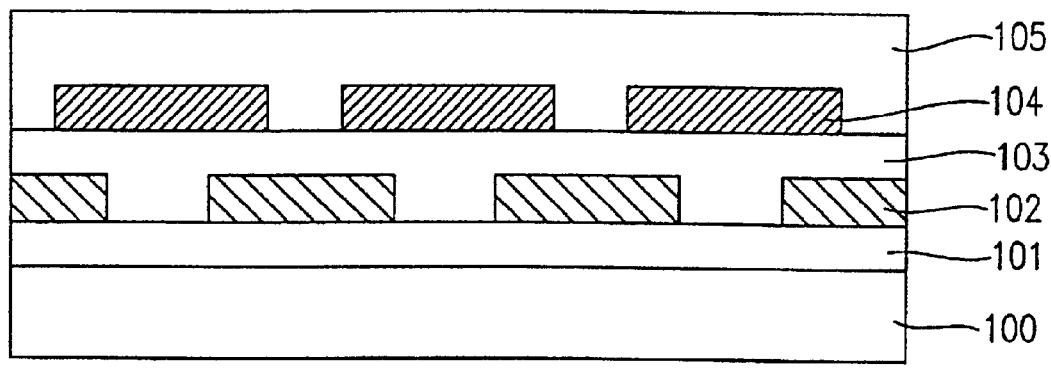
FIG. 1 is a cross-sectional view of a semiconductor substrate in Embodiment 1 of the present invention.

The present invention will be described by way of illustrative embodiments with reference to the drawings.

The term "growth suppressing effect" used in the specification and the attached claims of the present application refers to "an effect of suppressing a crystal growth on a mask". In addition, the term "twisted" is used herein to refer to a positional relationship in which two lines are disposed, without crossing in the same plane, so as to be not in parallel to each other.

Embodiment 1

A method for growing a crystal in the present embodiment will be described.

First, a GaN layer 101 is grown to a thickness of about 4 µm, using trimethyl gallium (TMG) and ammonia ($NH_3$) as materials, on a sapphire substrate 100 having a C-plane as its surface placed in a predetermined growth chamber. The sapphire substrate 100 and the GaN layer 101 are included in a lower substrate. The GaN layer 101 is a lower semiconductor crystal layer as well as a lower nitride semiconductor crystal layer.

Then, in order to form a first patterned mask, a film (thickness: about 200 nm) made of a growth suppressing material ($SiO_2$) is formed on the GaN layer 101 by sputtering. A method for forming the $SiO_2$ film is not limited to sputtering. Other methods, such as vacuum vapor deposition and chemical vapor deposition (CVD), may be used. Furthermore, as a growth suppressing material, oxides such as $Al_2O_3$ and $TiO_2$ and $SiN_x$ can be used in place of $SiO_2$. Then, the $SiO_2$ film is patterned to a periodic stripe (width: about 7 µm; pitch: about 10 µm) by a conventional photolithography method, whereby a first $SiO_2$ mask 102 is formed. The direction of the stripe is desirably a <1-100> direction of a crystal of the GaN layer 101.

By using the lower substrate thus obtained, a GaN crystal film 103 is grown by a metal-organic-vapor-phase epitaxy (MOVPE) method. More specifically, the GaN crystal film 103 is grown to a thickness of about 3 µm at a growth temperature of about 1050° C., using TMG and $NH_3$ as materials, in a predetermined growth chamber. The GaN crystal film 103 starts growing from openings in the first mask, and is flatly grown over substantially the entire surface of the lower substrate due to anisotropy (i.e., a growth speed in a direction horizontal to the lower substrate is higher than that in a direction vertical to the lower substrate).

A defect density on the first mask is about $10^5/cm^2$ or less; however, a defect density on the sapphire substrate in the opening portions of the first mask is about $10^7/cm^2$. In the conventional example, although a laser device is formed avoiding such portions, reliability and yield are not sufficient.

Then, a second mask is formed on the GaN crystal film 103. More specifically, an $SiO_2$ film (thickness: about 200 nm) is formed by sputtering in the same way as in the first mask, and a second $SiO_2$ mask 104 with a periodic stripe pattern (width: about 8 µm; pitch: about 10 µm) is formed by a photolithography method. At this time, it is important that the position of the second mask is matched with the openings in the first mask.

Then, a GaN single crystal film 105 is grown on the second $SiO_2$ film by a MOVPE method. More specifically, GaN is grown to a thickness of about 3 µm at a growth temperature of about 1050° C., using TMG and $NH_3$ as materials, in a predetermined growth chamber. Thus, a semiconductor substrate is completed.

In the GaN single crystal film 105 grown in the present embodiment, a defect density is decreased to about 1500/$cm^2$ or less, and crystallinity is remarkably improved.

In the case where the first mask and the second mask have a stripe width of about 4 µm and a pitch of about 10 µm, and the first and second masks are positioned so as to be shifted by a half pitch (in the case where the stripe width of the second mask is smaller than each opening of the first mask) in the present embodiment, a defect density becomes about 5000/$cm^2$. Thus, an effect of a sufficient decrease in crystal defects is observed when compared with the case of using only the first mask in the conventional example. A defect density becomes relatively small in the case where the stripe width of the second mask is larger than each opening of the first mask, and the first and second masks completely cover crystal threading dislocation extending upward from the sapphire substrate 100. Accordingly, it is confirmed that it is important to form the second mask so as to completely cover the openings of the first mask.

On the other hand, the following is found according to X-ray diffraction measurement: in the case where the stripe width of the second mask is smaller than each opening of the first mask, a defect density is decreased to some degree (about 5000/$cm^2$), and a c-axis alignment of a GaN continuous film is improved. The following is confirmed in the case where the stripe width of the second mask is larger than each opening of the first mask, a ω value (full width at half maximum) of X-ray diffraction representing alignment variation is about 4 to 6 arcminutes; however, in the case where the stripe width of the second mask is smaller than each opening of the first mask, alignment variation (ω value) of a crystal is reduced to 2 arcminutes in a wafer plane. Thus, in the case where an LED, a semiconductor laser device, or the like is produced under the condition that the stripe width of the second mask is smaller than each opening of the first mask, a light-emitting efficiency is degraded compared with the case where the stripe width of the second mask is larger than each opening of the first mask; however, a light-emitting efficiency in a wafer plane and uniformity of a threshold current of a laser are improved, which enhances the production yield of a device. Accordingly, it is important to select the relationship between the size of each opening of the first mask and the stripe width of the second mask, depending upon required characteristics of a light-emitting device. Furthermore, if the first and second masks are formed of the same material, the same vapor deposition apparatus can be used, and quality of crystal films can be stabilized by the same growth suppressing effect (in the case of giving a high priority to a light-emitting efficiency, the stripe width of the second mask should be prescribed to be larger than each opening of the first mask; in the case of giving a high priority to uniformity of characteristics and yield, the stripe width of the second mask should be prescribed to be smaller than each opening of the first mask).

Embodiment 2

Figure 2:
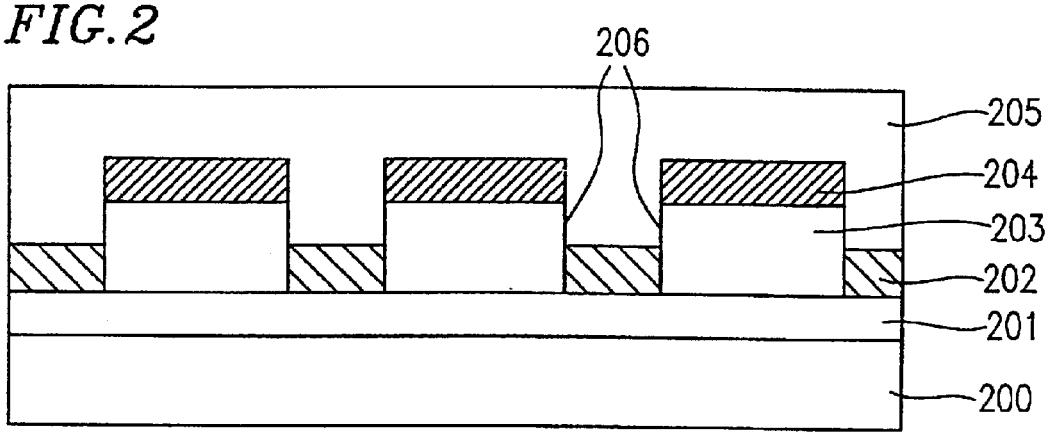
FIG. 2 is a cross-sectional view of a semiconductor substrate in Embodiment 2 of the present invention.

FIG. 2 shows the second embodiment. The second embodiment is different from the first embodiment in that a GaN crystal film 203 grown by using a first mask is not a continuous film, and a second mask is formed on the GaN crystal film 203 grown in the shape of an island.

First, a GaN layer 201 is grown to a thickness of about 4 $\mu$m on a sapphire substrate 200 in the same way as in Embodiment 1. In the case of the second embodiment, a first GaN crystal film 203 grown by using a first SiO$_2$ mask 202 is prescribed to have a thickness of about 1 $\mu$m, a width of about 7 $\mu$m, and a pitch of about 10 $\mu$m. Then, a second GaN single crystal film 205 (thickness: about 4 $\mu$m) is grown by using a second SiO$_2$ mask 204 (thickness: about 200 nm). A defect density is about 800/cm$^2$ or less. Thus, a satisfactory crystal is obtained. This is an effect that the GaN single crystal film 205 grows only from side surfaces 206 where there are few defects in the first GaN crystal.

Embodiment 3

Figure 3:
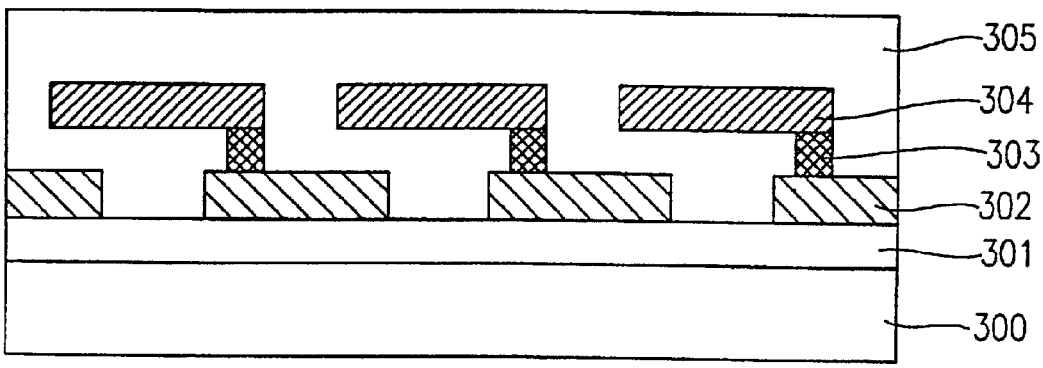
FIG. 3 is a cross-sectional view of a semiconductor substrate in Embodiment 3 of the present invention.

The third embodiment will be described with reference to FIG. 3. In Embodiment 1, it is required to conduct crystal growth of GaN for a patterned mask by two steps; however, in Embodiment 3, one step of crystal growth suffices, which results in a cost advantage.

First, an SiO$_2$ film is formed to a thickness of about 200 nm on a sapphire substrate 300 with a GaN layer 301 formed thereon, by sputtering in the same way as in Embodiment 1. The SiO$_2$ film is etched to a stripe shape (width: about 4 $\mu$m; pitch: about 8 $\mu$m) by a conventional photolithography method, whereby a first SiO$_2$ mask 302 is formed. Then, an SiO$_2$ film is formed on the resultant substrate in the same way as the above, whereby a second lower SiO$_2$ mask 303 in the shape of a stripe (width: about 2 $\mu$m; pitch: about 8 $\mu$m) is formed on the first SiO$_2$ mask 302. Then, a portion other than the lower SiO$_2$ mask 303 is covered with a photoresist film by conventional photolithography. More specifically, a photoresist such as AZ (produced by SHIPLEY is spin-coated over the entire surface of the GaN layer 301, the first SiO$_2$mask 302, and the lower SiO$_2$ mask 303. Then, only the lower SiO$_2$ mask 303 is exposed to light and developed, and the photoresist film is removed. Furthermore, an SiO$_2$ film is formed to obtain a second upper SiO$_2$ mask 304 in the shape of a stripe (width: about 5 $\mu$m; pitch: about 8 $\mu$m). Thereafter, the above-mentioned photoresist film is removed with a solvent such as acetone. The second lower SiO$_2$ mask 303 and the second upper SiO$_2$ mask 304 form a second mask in the shape of a letter "L". GaN is grown by a MOVPE method by using the resultant substrate. More specifically, a GaN single crystal film 305 is grown to a thickness of about 3 $\mu$m at a growth temperature of about 1050° C., using TMG and NH$_3$ as materials, in a predetermined growth chamber. Thus, a semiconductor substrate is completed.

Herein, crystal growth of the GaN single crystal film 305 starts from openings of the first SiO$_2$ mask 302. Then, the crystal growth in a direction vertical to the substrate stops at the second upper SiO$_2$ mask 304. Thereafter, the crystal growth proceeds in a direction parallel to the substrate. The crystal growth also starts from openings of the second upper SiO$_2$ mask 304 in a direction vertical to the substrate. Finally, a crystal is grown uniformly over the entire surface of the substrate.

In the present embodiment, dislocation in a direction vertical to the substrate, which is generated from the interface between the GaN layer 301 and the sapphire substrate 300, stops at the second upper SiO$_2$ mask 304, and dislocation in a direction horizontal to the substrate stops at the second lower SiO$_2$ mask 303. Thus, the obtained GaN single crystal film 305 is of satisfactory quality (i.e., a defect density is about 600/cm$^2$ or less).

Embodiment 4

Figure 4:
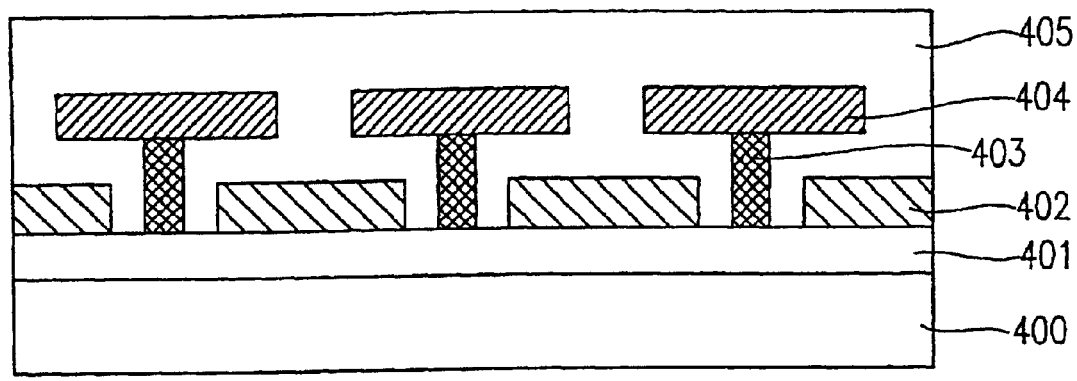
FIG. 4 is a cross-sectional view of a semiconductor substrate in Embodiment 4 of the present invention.

The fourth embodiment will be described with reference to FIG. 4.

First, an SiO$_2$ film is formed to a thickness of about 200 nm on a sapphire substrate 400 with a GaN layer 401 formed thereon, by sputtering in the same way as in Embodiment 1. The SiO$_2$ film is etched to a stripe shape (width: about 4 $\mu$m; pitch: about 8 $\mu$m) by a conventional photolithography method, whereby a first SiO$_2$ mask 402 is formed. Then, a second lower SiO$_2$ mask 403 is formed to a stripe shape (width: about 2 $\mu$m; pitch: about 8 $\mu$m) on the GaN layer 401. Then, a portion other than the lower SiO$_2$ mask 403 is covered with a photoresist film by conventional photolithography. More specifically, a photoresist such as AZ (produced by SHIPLEY) is spin-coated over the entire surface of the GaN layer 401 and the first SiO$_2$ mask 402. Then, only the lower SiO$_2$ mask 403 is exposed to light and developed, and the photoresist film is removed. Furthermore, a second upper SiO$_2$ mask 404 in the shape of a stripe (width: about 5 $\mu$m; pitch: about 8 $\mu$m) is formed on the second lower SiO$_2$ mask 403. Thereafter, the above-mentioned photoresist film is removed with a solvent such as acetone. The second lower SiO$_2$ mask 403 and the second upper SiO$_2$ mask 404 form a second mask in the shape of a letter "T". GaN is grown by a MOVPE method by using the resultant substrate. More specifically, a GaN single crystal film 405 is grown to a thickness of about 3 $\mu$m at a growth temperature of about 1050° C., using TMG and NH$_3$as materials, in a predetermined growth chamber. Thus, a semiconductor substrate is completed.

Herein, crystal growth of the GaN single crystal film 405 starts from openings of the first SiO$_2$ mask 402. Then, the crystal growth in a direction vertical to the substrate stops at the second upper SiO$_2$ mask 404. Thereafter, the crystal growth proceeds in a direction parallel to the substrate. The crystal growth also starts from openings of the second upper SiO$_2$ mask 404 in a direction vertical to the substrate. Finally, a crystal is grown uniformly over the entire surface of the substrate.

In the present embodiment, dislocation in a direction vertical to the substrate, which is generated from the interface between the GaN layer 401 and the sapphire substrate 400, stops at the second upper SiO$_2$ mask 404, and dislocation in a direction horizontal to the substrate stops at the second lower SiO$_2$ mask 403. Thus, the obtained GaN single crystal film 405 is of satisfactory quality (i.e., a defect density is about 800/cm$^2$ or less).

Embodiment 5

Figure 5:
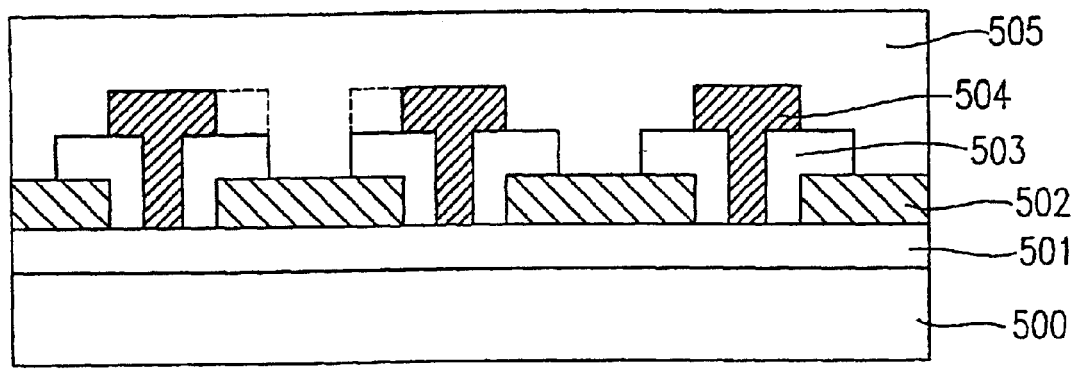
FIG. 5 is a cross-sectional view of a semiconductor substrate in Embodiment 5 of the present invention.

The fifth embodiment will be described with reference to FIG. 5.

First, in order to form a first patterned mask, a film made of a growth suppressing material (SiO$_2$) is formed to a thickness of about 200 nm by sputtering on a sapphire substrate 500 having a C-plane as its surface on which a GaN layer 501 is formed. A method for forming the SiO$_2$film is not limited to sputtering. Another method, such as vacuum vapor deposition or CVD, may be used. Furthermore, as a growth suppressing material, oxides such as Al$_2$O$_3$ and TiO$_2$ and SiN$_x$ can be used in place of SiO$_2$. Then, openings in the shape of a stripe (width: about 3 $\mu$m; pitch: about 100 $\mu$m) are provided in the SiO$_2$ film by a conventional photolithography method, whereby a first SiO$_2$ mask 502 is formed. The direction of the stripes is desirably <1-100> with respect to the GaN layer 501.

GaN is grown by a MOVPE method by using the resultant substrate. More specifically, GaN 503 is grown to a thickness of about 0.5 $\mu$m at a growth temperature of about 1050° C., using TMG and NH$_3$ as materials, in a predetermined growth chamber. The GaN 503 is grown only at edge portions of the first SiO$_2$ mask 502 without burying the first SiO$_2$ mask 502. The edge portions have a low potential with respect to other portions, so that the GaN 503 is of satisfactory quality without any defects.

Then, a second mask is formed on the resultant substrate. More specifically, SiO$_2$ is deposited to a thickness of about 200 nm by sputtering in the same way as in the first SiO$_2$ mask 502, whereby a second SiO$_2$ mask 504 is formed in the shape of a stripe (width: 5 $\mu$m; pitch: 100 $\mu$m) by a photolithography method. It is important that the positions of light-blocking portions are substantially matched with the openings of the first SiO$_2$ mask 502.

Then, a GaN single crystal film 505 is grown by a MOVPE method, by using the resultant substrate. More specifically, GaN is grown to a thickness of about 3 $\mu$m at a growth temperature of about 1050° C., using TMG and NH$_3$ as materials, in a predetermined growth chamber. Thus, a semiconductor substrate is completed.

In the GaN single crystal film 505 grown in the present embodiment, a defect density is decreased to about 1000/cm$^2$ or less over the entire surface thereof, and crystallinity is remarkably improved.

Herein, it is important that the light-blocking portions of the second SiO$_2$ mask 504 cover the openings of the first SiO$_2$ mask 502.

Embodiment 6

Figure 6:
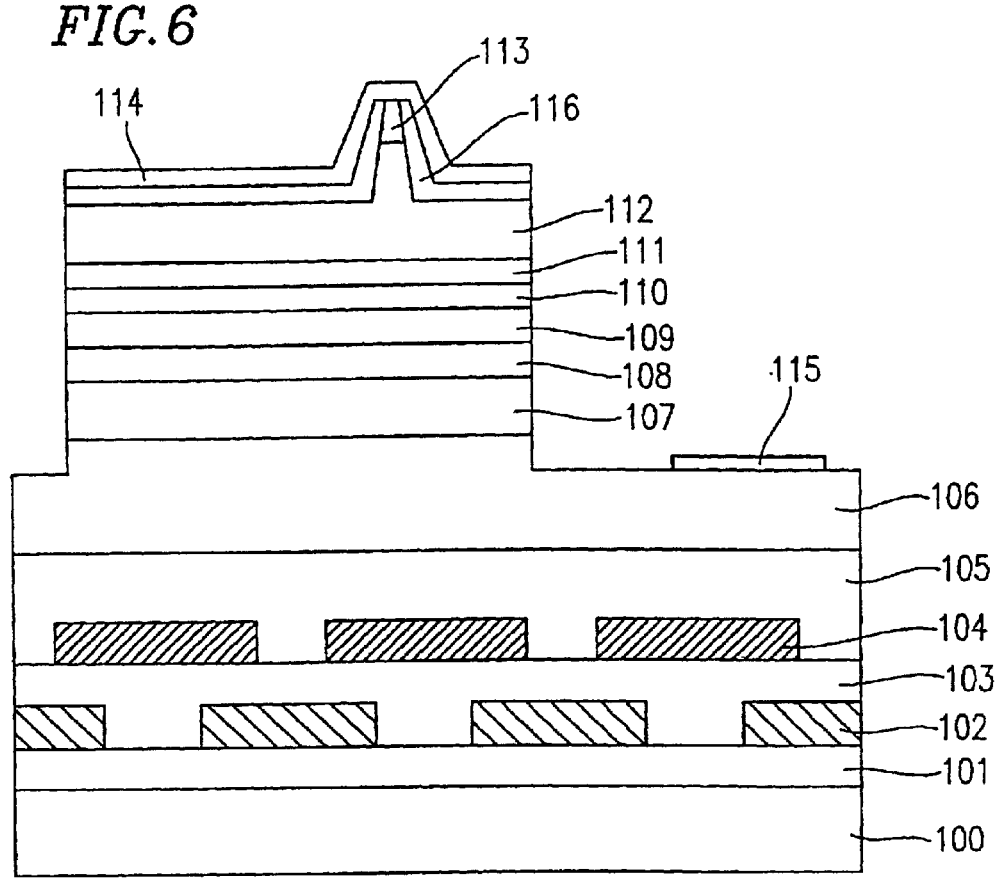
FIG. 6 is a cross-sectional view of a semiconductor laser device in Embodiment 6 of the present invention.

The sixth embodiment will be described with reference to FIG. 6. Herein, the same reference numerals as those in Embodiment 1 denote the same elements as those herein.

A semiconductor laser device in the present embodiment includes an n-GaN contact layer 106, an n-Al$_{0.1}$Ga$_{0.9}$N cladding layer 107, an n-GaN guide layer 108, a multi quantum-well structure active layer 109 including 5 In$_{0.2}$Ga$_{0.8}$N quantum-well layers and 6 In$_{0.05}$Ga$_{0.95}$N barrier layers, an Al$_{0.2}$Ga$_{0.8}$N evaporation preventing layer 110, a p-GaN guide layer 111, a p-Al$_{0.1}$Ga$_{0.9}$N cladding layer 112, a p-GaN contact layer 113, a p-type electrode 114, an n-type electrode 115, and an SiO$_2$ insulating film 116.

According to the present invention, the surface of the sapphire substrate 100 may have another orientation, such as an a-plane, an r-plane, and an m-plane. Furthermore, a GaN substrate, an SiC substrate, a spinnel substrate, an MgO substrate, an Si substrate, and a GaAs substrate can be used in place of a sapphire substrate. Particularly in the case of using a GaN substrate, compared with the case of using a sapphire substrate, at least the following advantages are obtained: a difference in a lattice constant between the substrate and a gallium nitride type semiconductor material deposited on the substrate is smaller, and a film with satisfactory crystallinity can be obtained. Furthermore, the GaN substrate is more likely to be cleaved, so that it is easier to produce a laser resonator by cleavage. The cladding layer 107 and the cladding layer 112 may be made of a mixed crystal containing three elements (AlGaN) having an Al mole fraction other than Al$_{0.1}$Ga$_{0.9}$N. In this case, when an Al mole fraction is increased, a difference in an energy gap and a difference in a refractive index between the active layer and the cladding layer becomes larger, so that carriers and light are confined in the active layer, which further decreases an oscillation threshold current and improves temperature characteristics. Furthermore, when an Al mole fraction is decreased to such a degree that carriers and light can be confined, the mobility of carriers in the cladding layer becomes large. Therefore, the resistance of a semiconductor laser device can be decreased. Furthermore, the cladding layers 107 and 112 may be made of a mixed crystal semiconductor containing a trace amount of another element in addition to the above-mentioned three elements, and the mole fractions of a mixed crystal are not required to be the same between the cladding layer 107 and the cladding layer 112.

The guide layers 108 and 111 may be made of any material which allows an energy gap therebetween to have a value between an energy gap of the quantum-well layers included in the active layer 109 and a energy gap of the cladding layers 107 and 112. For example, a mixed crystal containing three elements (e.g., InGaN or AlGaN) may be used. Furthermore, it is not necessary to dope a donor or an acceptor over the entire guide layers 108 and 111, and only a portion thereof on the side of the active layer 109 may be non-doped. Furthermore, the entire guide layers 108 and 111 may be non-doped. In this case, there is an advantage that the number of carriers present in the guide layers 108 and 111 becomes small, light absorption by free carriers is decreased, and an oscillation threshold current can be further reduced.

With the quantum-well layers and the barrier layers included in the active layer 109, mole fractions should be set in accordance with a required laser oscillation wavelength. In the case where it is desirable to make an oscillation wavelength longer, the In mole fraction of the quantum-well layers is increased. In the case where it is desired to shorten an oscillation wavelength, the In mole fraction of the quantum-well layers is decreased. Furthermore, the quantum-well layers and the barrier layers maybe made of a mixed crystal semiconductor containing four or more elements including a trace amount of another element in addition to a mixed crystal containing three elements (InGaN). The barrier layers may be made of GaN.

In the present embodiment, the evaporation preventing layer 110 is formed in contact with the active layer 109. The purpose of this is to prevent the active layer 109 from evaporating during an increase in a growth temperature. Therefore, any material can be used for the evaporation preventing layer 110 as long as it protects the active layer 109. For example, a mixed crystal containing three elements (AlGaN) having another Al mole fraction and GaN may be used. Furthermore, Mg may be doped into the evaporation preventing layer 110. In this case, there is an advantage that holes can be easily injected from the guide layer 111 and the cladding layer 112. Furthermore, in the case where the In mole fraction of the quantum-well layers included in the active layer 109 is small, the quantum-well layers are not evaporated, so that the evaporation preventing layer 110 is not required to be formed. Even if the evaporation preventing layer 110 is not formed, characteristics of a gallium nitride type semiconductor laser device in the present embodiment will not be impaired.

Hereinafter, a method for producing the above-mentioned gallium nitride type semiconductor laser device will be described with reference to FIG. 6.

In the following description, the case of using a MOVPE method is shown. However, any method which is capable of epitaxially growing GaN may be used. For example, another vapor growth method such as molecular beam epitaxy (MBE) or HVPE can be used.

First, the contact layer 106 doped with Si is grown to a thickness of about 3 $\mu$m at a growth temperature of about 1050° C., using TMG, NH$_3$, and a silane gas (SiH$_4$) as materials, on the substrate produced in Embodiment 1 placed in a predetermined growth chamber. Then, trimethyl aluminum (TMA) is added to the materials, and the cladding layer 107 doped with Si is grown to a thickness of about 0.4 μm at a growth temperature of about 1050° C. TMA is removed from the materials, and the guide layer 108 doped with Si is grown to a thickness of about 0.1 μm at a growth temperature of about 1050° C.

Next, the growth temperature is lowered to about 750° C., and 5 barrier layers (thickness: about 5 nm) and 5 quantum-well layers (thickness: about 2 nm) are alternately grown and the barrier layer (thickness: about 5 nm) is grown, using TMG, $NH_3$ and trimethyl indium (TMI), whereby the active layer 109 (total thickness: about 40 nm) is produced. Then, the evaporation preventing layer 110 is grown to a thickness of about 20 nm at a growth temperature of about 750° C., using TMG, TMA, and $NH_3$ as materials.

Next, the growth temperature is raised to about 1050° C., and the guide layer 111 doped with Mg is grown to a thickness of about 0.1 μm, using TMG, $NH_3$, and bisethyl-cyclopentadienyl magnesium ($EtCP_2Mg$) as materials. TMA is added to the materials, and the cladding layer 112 is grown to a thickness of about 0.4 μm at a growth temperature of about 1050° C. TMA is removed from the materials, and the contact layer 113 doped with Mg is grown to a thickness of about 0.2 μm at a growth temperature of about 1050° C. Thus, a gallium nitride type epitaxial wafer is completed. Thereafter, the wafer is annealed in a nitrogen gas atmosphere at about 800° C., whereby the Mg-doped p-type layers are rendered low-resistant.

Furthermore, etching is conducted from the top surface of the contact layer 113 so as to obtain a stripe shape (width: about 200 μm) by using conventional photolithography and dry etching until the contact layer 106 is exposed, whereby a mesa structure is produced. Next, using the photolithography and dry etching similar to the above, the remaining contact layer 113 and the cladding layer 112 are etched. At this time, a stripe-shaped ridge structure should be positioned about 3 μm or more away from both ends of the mesa structure with a width of about 200 μm. In the present embodiment, the ridge structure is formed about 10 μm away from the end of the mesa structure on the side where the n-type electrode 115 is to be formed. If the ridge structure is positioned so as to be close to the n-type electrode 115 as described above, the electric resistance of the device is decreased, and the working voltage is reduced. Furthermore, the dry etching is stopped so as not to etch the active layer 109. Thus, the active layer 109 is protected from etching damage, which prevents a decrease in reliability and an increase in an oscillation threshold current.

The insulating film 116 is formed to a thickness of about 200 nm as a current blocking-layer on the side surfaces of the ridge structure and on the surface of the p-type layer excluding the ridge. The p-type electrode 114 made of nickel and gold is formed on the surface of the insulating layer 116 and the contact layer 113, and the n-type electrode 115 made of titanium and aluminum is formed on the surface of the contact layer 106 exposed by etching. Thus, a gallium nitride type laser device wafer is completed.

Thereafter, the wafer thus obtained is cleaved in a direction vertical to the ridge stripe to form a resonance plane, and the wafer is divided into chips. Each chip is mounted on a stem, and each electrode is connected to each lead terminal by wire bonding. Thus, a gallium nitride type semiconductor laser device is completed.

In the semiconductor laser device produced as described above, satisfactory laser characteristics (oscillation wavelength: about 410 nm; oscillation threshold value: about 20 mA) are obtained. Furthermore, due to a decrease in crystal defects, the semiconductor laser device thus obtained is highly reliable (about $10^5$ hours at about 60° C.). Furthermore, a ratio of laser devices having crystal defects is remarkably decreased, with a yield being about 80% or higher.

In the present embodiment, thicknesses of each quantum-well layer and each barrier layer included in the active layer 109 are about 2 nm and about 5 nm, respectively. However, as long as the thickness of each quantum-well layer and each barrier layer is prescribed to be about 10 nm or less, the same effects can be obtained irrespective of embodiments. Furthermore, the number of quantum-well layers in the active layer 109 may be 2, 3 or 4. Alternatively, a single quantum-well structure active layer may be used.

In the present embodiment, sapphire, which is an insulator, is used for the substrate, so that the n-type electrode 115 is formed on the surface of the contact layer 106 exposed by etching. However, if GaN, SiC, Si, GaAs, or the like having an n-type insulating property is used, the n-type electrode 115 may be-formed on the reverse surface of the substrate. In this case, the mesa structure with a width of about 200 μm should be positioned at least about 3 μm away from both ends of the semiconductor laser device chip. P-type structures and n-type structures may be reversed.

Embodiment 7

Figure 7A:
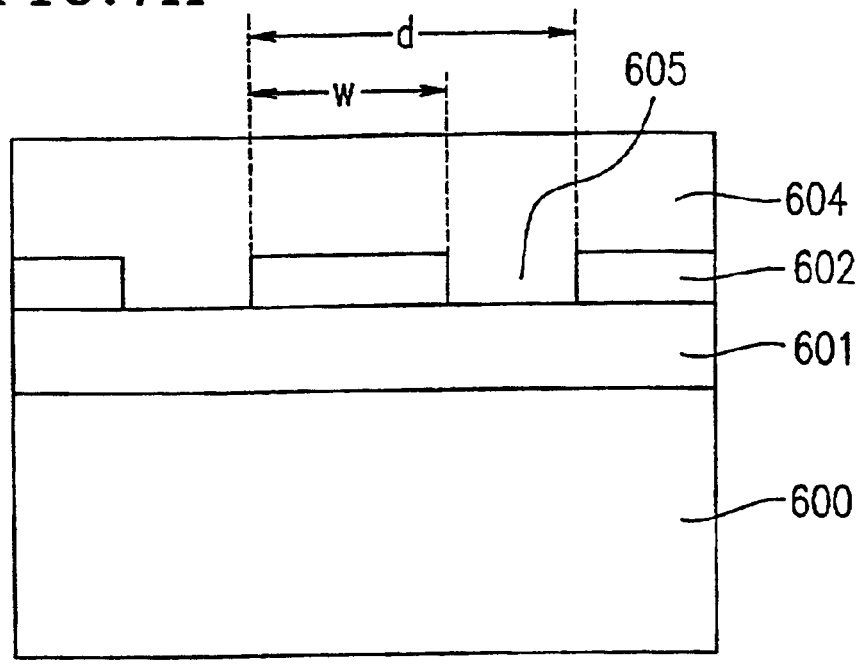
FIGS. 7A and 7B are views illustrating the steps of producing semiconductor substrates in Embodiments 7 and 8 of the present invention.

Referring to FIG. 7A, a method for growing a crystal in Embodiment 7 will be described. FIG. 7A is a cross-sectional view of a nitride semiconductor to be formed.

First, a GaN layer 601 is grown to a thickness of about 2 μm, using TMG and $NH_3$ as materials, on a sapphire substrate 600 having a C-plane as its surface placed in a predetermined growth chamber. The sapphire substrate 600 and the GaN layer 601 are included in a lower substrate. The GaN layer 601 is a lower semiconductor crystal layer as well as a lower nitride semiconductor crystal layer.

Figure 7B:
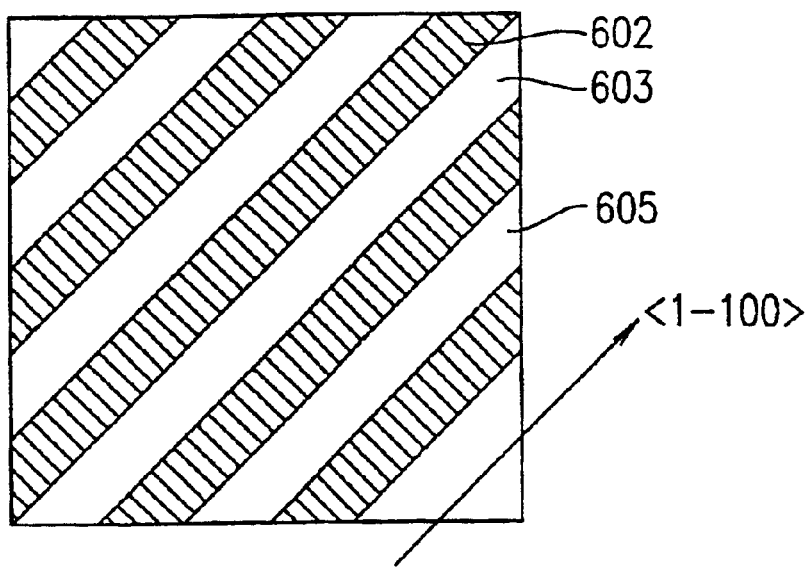

Then, in order to form a first mask pattern, a film (thickness: about 100 nm) made of a growth suppressing material ($SiO_2$) is formed on the GaN layer 601 by sputtering. A method for forming the $SiO_2$ film is not limited to sputtering. Another method, such as CVD, electron beam (EB) vapor deposition, or vacuum vapor deposition, may be used. Furthermore, as a growth suppressing material, oxides such as $Al_2O_3$ and $TiO_2$ and $SiN_x$ can be used in place of $SiO_2$. Then, the $SiO_2$ film is patterned to a periodic stripe (width w: about 7 μm; pitch d: about 10 μm) by a conventional photolithography method, whereby a first mask pattern 602 is formed. FIG. 7B is a plan view of a nitride semiconductor to be formed. As shown in FIG. 7B, the direction of the stripe is prescribed to be a [1-100] direction of a GaN crystal.

By using the substrate with the first mask pattern thus obtained, a first GaN film 604 is grown by a MOVPE method. More specifically, the first GaN film 604 is grown to a thickness of about 5 μm at a growth temperature of about 1050° C., using TMG and $NH_3$ as materials, in a predetermined growth chamber. Thus, the first step is completed. The first GaN film 604 starts growing from openings 605 in the first mask pattern 602, and is flatly grown over substantially the entire surface of the sapphire substrate due to anisotropy (i.e.; a growth speed in a direction horizontal to the substrate, particularly, in a <11-20> direction with respect to a GaN crystal, is higher than that in a direction vertical to the substrate).

Portions of the first GaN film 604 on the first mask pattern 602 grown in a direction vertical to the stripe of the first mask pattern 602 have a very weak inter-atom bond with respect to the first mask pattern 602 (i.e., these portions are not epitaxially grown from the first mask pattern 602); therefore, lattice strains are not caused in these portions. However, lattice strains remain in a direction parallel to the stripe due to a difference in a lattice constant between the GaN layer 601 and the sapphire substrate 600, and the lattice strains are also reflected onto the first GaN film 604. During the first step, problems of lattice strains and a high threading dislocation density are not overcome. Thus, when a semiconductor laser is formed on the first GaN film 604 including the lattice strains and having a high threading dislocation density, a continuous oscillation time of the device at room temperature is about 900 hours. This oscillation life does not satisfy reliability of the device.

Furthermore, as described above, since the portions of the first GaN film 604 immediately above the first mask pattern 602 have a very weak inter-atom bond with respect to the first mask pattern 602, these portions are unlikely to be influenced by thermal strains from the underlying layer (i.e., the sapphire substrate 600). However, a GaN crystal above the openings in the first mask pattern 602 is more strongly influenced by thermal strains from the underlying layer (i.e., the sapphire substrate 600).

The portions of the first GaN film 604 immediately above the first mask pattern 602 has a threading dislocation density of the order of $10^4$ to $10^5/cm^2$. The portions of the first GaN film 604 immediately above the openings of the first mask pattern 602 have a threading dislocation density of the order of $10^7$ to $10^8/cm^2$. In the conventional example, a laser device is formed avoiding the portions including lattice strains, thermal strains, and the like, which makes reliability and yield of the device insufficient.

Then, a second mask pattern 606 (FIG. 8) made of $SiO_2$ is formed on the surface of the first GaN film 604. More specifically, an $SiO_2$ film (thickness: about 100 nm) formed by the same method as that of the first mask pattern 602 is subjected to conventional photolithography and etching, whereby the periodic second mask pattern 606 (width: about 8 μm; pitch: about 10 μm) made of $SiO_2$ is formed. Furthermore, under the condition that the stripe direction of the second mask pattern 606 is observed from above the wafer, the stripe direction of the second mask pattern 606 is prescribed to be a [01-10] direction of a GaN crystal so that it forms an angle of about 120° with respect to the stripe direction of the first mask pattern 602. FIG. 8 is a plan view of the semiconductor device in this state. For description, FIG. 8 shows the mask patterns as seen from the top.

The second mask pattern 606 is formed to have a width larger than that of the first mask pattern 602 by about 1 μm, so that the second mask pattern 606 covers the surface of the underlying first GaN film 604 more widely than the first mask pattern 602.

Figure 9A:
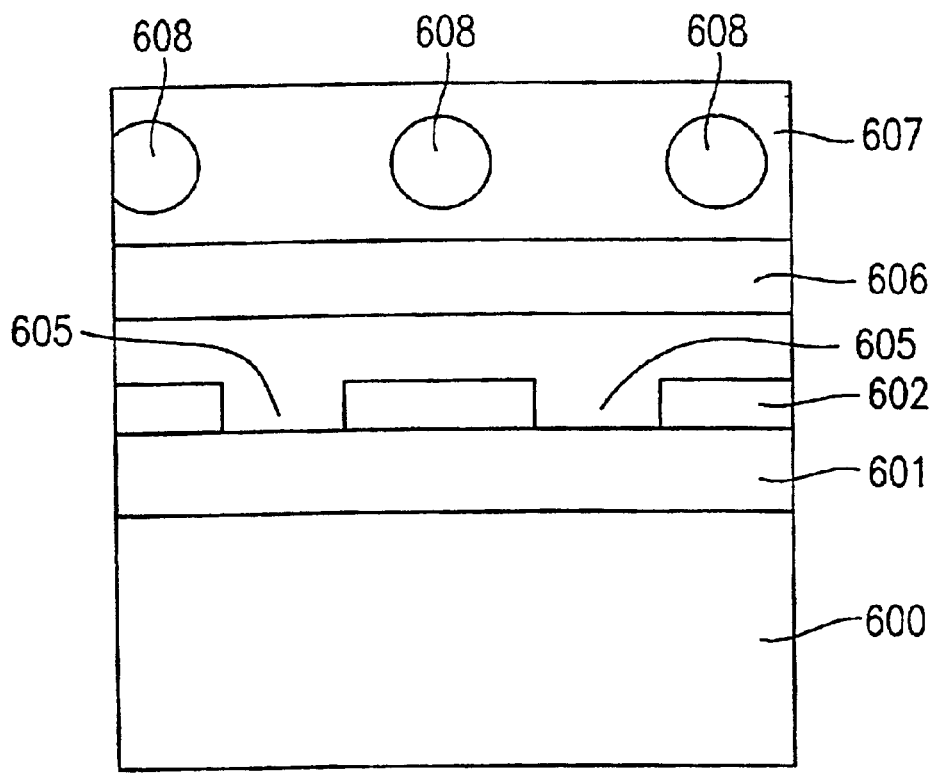
FIGS. 9A and 9B are views illustrating the steps of producing the semiconductor substrates in Embodiments 7 and 8 of the present invention.
Figure 9B:
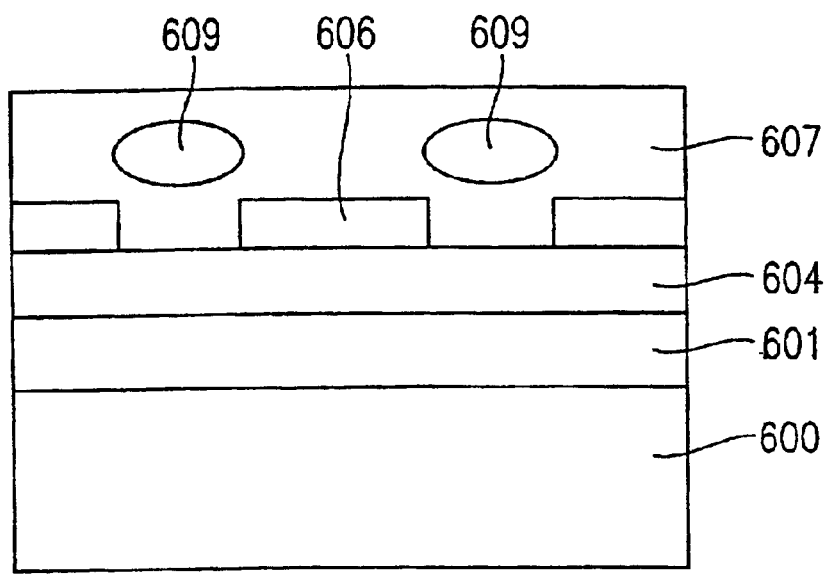

Next, a second GaN film 607 (FIG. 9A) is grown over the entire surface of the first GaN film 604 with the second mask pattern 606 formed thereon by an MOCVD method. Thus, the second step is completed. The growth of the second GaN film 607 is conducted at a substrate temperature of about 1050° C., using TMG and $NH_3$ as materials. The second GaN film 607 has a thickness of about 5 μm. Accordingly, the second GaN film 607 is grown uniformly over the entire surface of the wafer including upper portions of the second mask pattern 606, and the surface of the second GaN film 607 becomes substantially flat. FIG. 9A is across-sectional view taken along a line a–a' parallel to the second mask pattern 606 in FIG. 8, and FIG. 9B is across-sectional view taken along a line b–b' parallel to the first mask pattern 602 in FIG. 8. The cross-section taken along the line b–b' is obtained from an opening portion of the first mask pattern 602, and hence, the first mask pattern 602 cannot be observed in FIG. 9B.

Lattice strains in the second GaN film 607 grown during the second step are reduced in a direction vertical to the stripe of the second mask pattern 606 in the same way as in the first step, compared with the case where there is no second mask pattern 606. Lattice strains in a direction parallel to the stripe of the second mask pattern 606 become similar to that of the first GaN film 604. Lattice strains in the first GaN film 604 are reduced in a direction vertical to the first mask pattern 602 during the first step. Therefore, in the second GaN film 607, lattice strains are reduced in two directions, i.e., in a direction vertical to the stripe of the first mask pattern 602 and in a direction vertical to the stripe of the second mask pattern 606.

Furthermore, a threading dislocation density of the second GaN film 607 produced during the second step is decreased to the order of $10^3/cm^2$ in portions 608 immediately above the first and second mask patterns 602 and 606, and crystallinity is remarkably improved. Furthermore, a threading dislocation density of portions 609 of the second GaN film 607 grown from the opening portions of the first mask pattern 602 is on the order of $10^5/cm^2$ due to lateral growth caused by the second mask pattern 606. Furthermore, a threading dislocation density of portions 610 immediately above the first mask pattern 602 is on the order of about $10^4/cm^2$.

Figure 10A:
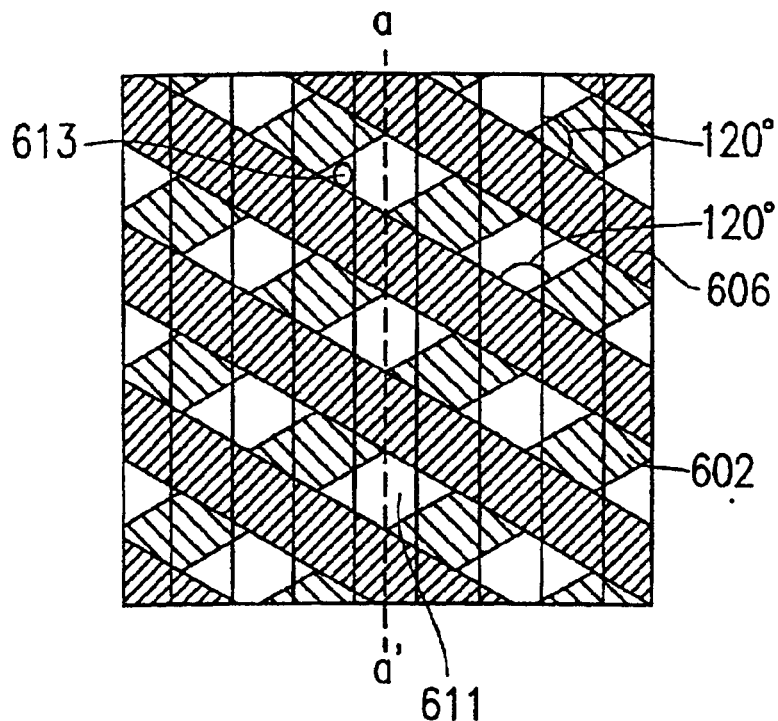
FIGS. 10A and 10B are views each illustrating the steps of producing the semiconductor substrate in Embodiment 7 of the present invention.

Furthermore, as the third step, a GaN crystal is grown on the second GaN film 607 by using a periodic stripe-shaped mask similar to those used during the first and second steps. First, an $SiO_2$ film (thickness: about 100 nm) is formed on the second GaN film 607 by the same method as that of the first step. The $SiO_2$ film is formed into a periodic stripe by conventional photolithography and etching, whereby a third mask pattern 611 with a width of about 8 μm and a period of about 10 μm is obtained. The third mask pattern 611 is disposed in such a manner that the stripe direction thereof forms an angle of about 120° with respect to any direction of the first and second mask patterns 602 and 606. That is, the stripe direction of the third mask pattern 611 is a [10-10] direction. FIG. 10A is a plan view of the semiconductor device in this state. For description, FIG. 10A shows the mask patterns as seen from the top.

Figure 10B:
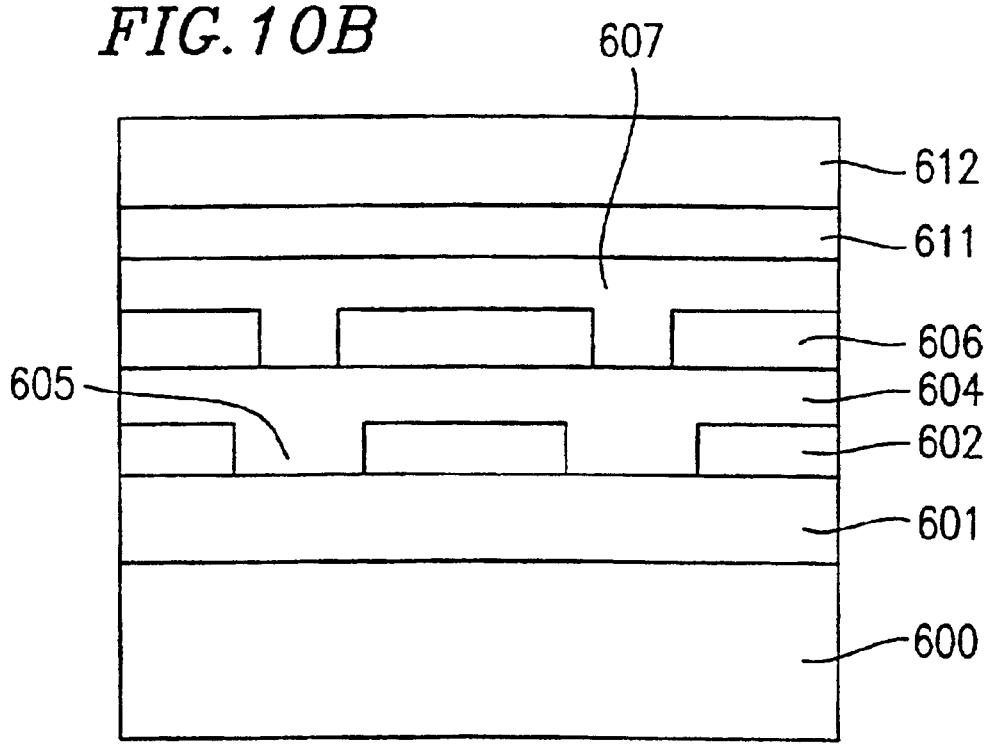

Next, a third GaN film 612 (thickness: about 5 μm) is grown on the second GaN film 607 with the third mask pattern 611 formed thereon in the same way as in the first and second steps. Thus, the third step is completed. The third GaN film 612 is also grown over the entire surface of the third mask pattern 611 made of $SiO_2$, and exhibits a single film having a substantially flat surface. Furthermore, in the third GaN film 612 formed during the third step, lattice strains in a direction vertical to the stripe of the third mask pattern 611 are further reduced, compared with the second GaN film 607. FIG. 10B is a view showing the semiconductor device, taken along a line a–a' in FIG. 10A.

As described above, the third GaN film 612 on the uppermost surface produced through three steps is obtained by growing a GaN crystal above three kinds of mask patterns 602, 606, and 611 which form an angle of about 120° with respect to each other. During the respective steps, lattice strains in a direction vertical to the stripes of the respective mask patterns are relaxed. Thus, the third GaN film 612 has strains reduced isotropically by three kinds of mask patterns which form the same angle with each other. As a result, a semiconductor substrate including the third GaN film 612 having substantially no strains in any in-plane direction is realized.

Furthermore, in the present embodiment, the stripe directions of the first mask pattern 602, the second mask pattern 606, and the third mask pattern 611 are prescribed to be [1-100], [01-10], and [10-10]. The present invention is not limited thereto. If the stripe directions of the first, second, and third mask patterns are a <1-100> direction, and the respective stripe directions have an angle difference of about 120°, there is an effect that substantially no strains are present in any in-plane direction. By prescribing the stripe direction of one of the first to third masks to be <1-100> and prescribing the stripe directions of the other mask patterns so that they have an angle difference of about 120°, an equivalent strain relaxing function is exhibited in a nitride semiconductor, and lateral growth of a crystal is promoted, whereby the mask patterns can be efficiently buried. Therefore, a decrease in a threading dislocation density and strain relaxation can be maximized.

A threading dislocation density on the surface of the third GaN film 612 is checked, revealing that a threading dislocation extending straight upward from the sapphire substrate 600 is covered with any of the first to third mask patterns, whereby a threading dislocation is prevented from extending through the masks. Therefore, a threading dislocation density on the surface of the third GaN film 612 can be reduced by one or more orders of magnitude (i.e., about $10^3/cm^2$ to about $10^4/cm^2$), compared with the conventional technique. Although portions 613 in the third GaN film 612 grown from the opening portions of the first mask pattern 602 are not covered with three kinds of mask patterns, their ratio with respect to the entire area is less than about 10%, and a threading dislocation is not increased in these portions. This may be because a threading dislocation is dispersed to the right and left during the step of forming a GaN film to a total of about 15 $\mu$m or more, and a threading dislocation is substantially uniformly distributed on the surface of the third GaN film 612 formed during the third step.

The first, second, and third mask patterns have the same thickness and are made of the same growth suppressing material ($SiO_2$) in Embodiment 7. However, these mask patterns may have different thicknesses and be made of different growth suppressing materials. In particular, if the same grown suppressing material is used for these mask patterns, the same growth chamber can be used, which is advantageous in terms of productivity, and the same growth suppressing effect is obtained, resulting in good controllability of growth. As a method for growing a nitride semiconductor, an HVPE method or an MBE method may be used in place of the above-mentioned MOVPE method.

Furthermore, in the present embodiment, the first to third nitride semiconductor crystal layers are formed by using the first to third masks. However, the present invention is not limited thereto. For example, it may be possible that the n-th nitride semiconductor crystal layer is formed on the n-th mask, and the (n+1)-th mask and the (n+1)-th nitride semiconductor crystal layer are formed in the same way as in the n-th step. Herein, n is an integer of 1 or more. Accordingly, by successively conducting a series of steps, crystal strains in a nitride semiconductor film during each step (strains caused by a difference in a lattice constant or a difference in a coefficient of thermal expansion between the substrate and the nitride semiconductor crystal) are reduced. Furthermore, a dislocation generated from the interface of the substrate will not emerge on the surface of a grown crystal film.

Even in the above case, in the same way as in the present embodiment, it is preferable that the first to (n+1)-th masks are combined with each other and patterned so as to cover the entire surface of the lower substrate. Because of this, a dislocation generated from the opening portions of the first mask pattern formed on the substrate or the nitride semiconductor film grown on the substrate is blocked with any of (n+1) mask patterns. Thus, a density of a threading dislocation which reaches the surface of the n-th nitride semiconductor film is remarkably reduced.

Furthermore, it is preferable that the n-th mask and the (n+1)-th mask are patterned to be striped, and the stripe directions of the n-th mask and the (n+1)-th mask are disposed so as to be twisted from each other. Because of this, a nitride semiconductor film crystal covering portions immediately above a mask pattern is unlikely to grow, due to selective growth, directly on the mask pattern, and the nitride semiconductor film crystal covering portions immediately above a mask pattern is laterally grown from the opening portions of the mask pattern in a direction vertical to the stripe direction of the mask pattern. Thus, portions of the (n+1)-th nitride semiconductor film on the (n+1)-th mask pattern grown in a direction vertical to the stripe of the (n+1)-th mask pattern have a very weak inter-atom bond with respect to the (n+1)-th mask pattern, so that lattice strains are not caused in these portions. However, in a direction parallel to a stripe, lattice strains are transferred from the underlying layer formed during or prior to the n-th step to the (n+1)-th nitride semiconductor film. This is also applicable to thermal strains.

Due to the twisted positional relationship among the mask patterns as described above, an effect of strains from the underlying layer can be canceled in various directions, as well as in one direction. The above-mentioned relaxation of strains has an effect of suppressing an edge dislocation from being generated.

Furthermore, it is preferable that the stripe directions of the n-th mask and the (n+1)-th mask are twisted from each other so as to have an angle difference of about 120°. A nitride semiconductor mainly has a wurtzite structure, so that there are three kinds of equivalent directions. These three directions have an angle difference of 120° from each other. By disposing the mask patterns produced during the above-mentioned steps so that they have an angle difference of about 120° from each other, these mask patterns have selection characteristics equivalent to each other, and strains can be relaxed by an equivalent strain relaxing function.

It is preferable that the stripe width of the (n+1)-th mask is equal to or larger than that of the n-th mask. If the stripe width of a mask pattern is increased with the increase in the number of the above-mentioned steps (i.e., an increase in n), a nitride semiconductor film produced during each step will have a decreased density of a threading dislocation generated from the substrate to the crystal layering direction.

A growth suppressing material may be $SiO_2$ or $SiN_x$, and the first to (n+1)-th masks may be independently made of $SiO_2$ or $SiN_x$. A mask pattern made of $SiO_2$ or $SiN_x$ has a sufficient growth suppressing effect.

The stripe direction of the n-th mask preferably agrees with a <1-100> direction or a <11-20> direction of a crystal of the nitride semiconductor crystal layer. In the case where the stripe direction of the mask pattern is <1-100>, a nitride semiconductor film formed particularly by an MOVPE method is laterally grown in a <11-20> direction vertical to the stripe direction, so that it is possible to bury the mask pattern with the nitride semiconductor thin film. Furthermore, depending upon growth characteristics, a threading dislocation hardly appears on the mask pattern. It is understood from these characteristics that the <1-100> stripe direction is very important for selective growth (lateral growth).

In the case where the stripe direction of the mask pattern is prescribed to be <11-20>, a nitride semiconductor crystal is laterally grown in a direction of <1-100>. In this case, a lateral growth speed of the nitride semiconductor crystal is lower than that in the case where the stripe direction of the mask pattern is set to be <1-100>. Furthermore, a threading dislocation which comes from the opening portions of a mask is bent in the direction of the mask, and is combined with another threading dislocation to extend in the crystal growth direction. Thus, compared with the case where the stripe direction of the mask pattern is prescribed to be <1-100>, a number of threading dislocations are generated even in portions on the mask. However, this does not mean that a new dislocation is generated immediately above the mask, but that a threading dislocation which comes from the opening portions of the mask is dispersed. As a result, a threading dislocation density is reduced in the same way as in the case where the stripe direction is prescribed to be <1-100>. According to one embodiment, the stripe direction of the mask pattern is prescribed to be <1-100> or <11-20>, whereby a lateral growth is promoted and the mask pattern is buried efficiently; thus, a decrease in a threading dislocation density and strain relaxation can be realized.

The n-th nitride semiconductor crystal layer may be made of $Al_xIn_yGa_zN$ ($x+y+z=1$, $0 \leq x \leq 1$, $0 \leq y \leq 1$, and $0 \leq z1$). Such a crystal is suitable for the growth method of the present invention due to its anisotropy (lateral growth).

It is preferable that the n-th nitride semiconductor crystal layer or the (n+1)-th nitride semiconductor crystal layer has a thickness of about 5 $\mu$m or more. A threading dislocation generated from the substrate is blocked by a mask pattern, and enters a nitride semiconductor film from the openings of the mask. However, by forming a thick nitride semiconductor crystal layer, the mask pattern can be covered with a GaN film, and a threading dislocation which is not blocked can be reduced by the thick nitride semiconductor crystal layer.

Embodiment 8

In Embodiment 8, the GaN film 607 formed during the second step in Embodiment 7 is evaluated for characteristics, in the case where the GaN film 607 is used as an underlying film of a device. More specifically, in Embodiment 7, mask formation and crystal growth on a mask are repeated three times. Herein, the effect of the present invention will be described, in the case where mask formation and crystal growth on a mask are repeated twice. In this case, the first and second mask patterns are formed so as to have an angle difference of about 120° from each other, so that lattice strains are reduced in two directions vertical to the stripe directions of two mask patterns. However, a small number of lattice strains remain in a direction (i.e., in a horizontal on the drawing surface of FIG. 8) which bisects an angle of about 120° formed by two mask patterns.

Furthermore, a threading dislocation density of the second GaN film 607 positioned immediately above the first and second mask patterns is reduced to about $10^3/cm^2$, and a threading dislocation density of the portions 609 in the second GaN film 607 grown from the opening portions of the first mask pattern is about $10^5/cm^2$. An average threading dislocation density on the entire surface of the second GaN film 607 is about $3 \times 10^4/cm^2$, which is a reduction of a threading dislocation by about one order of magnitude, compared with the conventional example. Regarding strains, as described in Embodiment 7, more satisfactory relaxation effect is obtained compared with the conventional example (only the first step), by conducting the second step of the present invention.

Embodiment 9

Figure 11A:
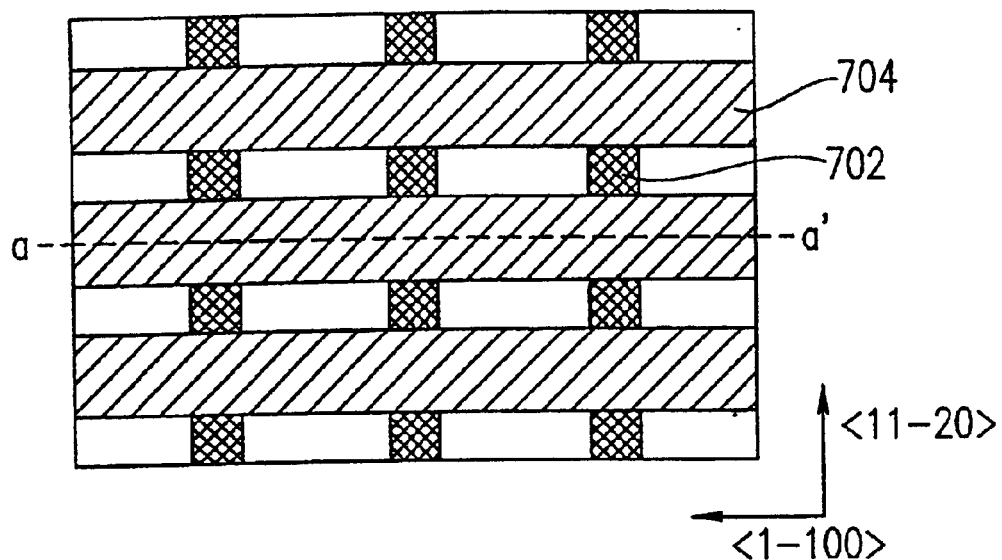
FIGS. 11A and 11B are views each illustrating a semiconductor substrate in Embodiment 9 of the present invention.

Embodiment 9 is an altered example of Embodiment 8. Embodiment 9 is the same as Embodiment 8, except that the stripe direction of the first mask pattern formed during the first step and the stripe direction of the second mask pattern formed during the second step have an angle difference of about 90°. FIG. 11A is a plan view of a GaN film formed in Embodiment 9. For description, FIG. 11A shows mask patterns as seen from the top. As shown in FIG. 11A, the stripe direction of a first mask pattern 702 and the stripe direction of a second mask pattern 704 form an angle of about 90°. The first and second mask patterns 702 and 704 are formed in a <11-20> direction and a <1-100> direction of a GaN crystal, respectively. It is preferable that the first and second mask patterns 702 and 704 are formed in a <11-20> direction and a <1-100> direction, respectively. However, the present invention is not limited thereto.

Figure 11B:
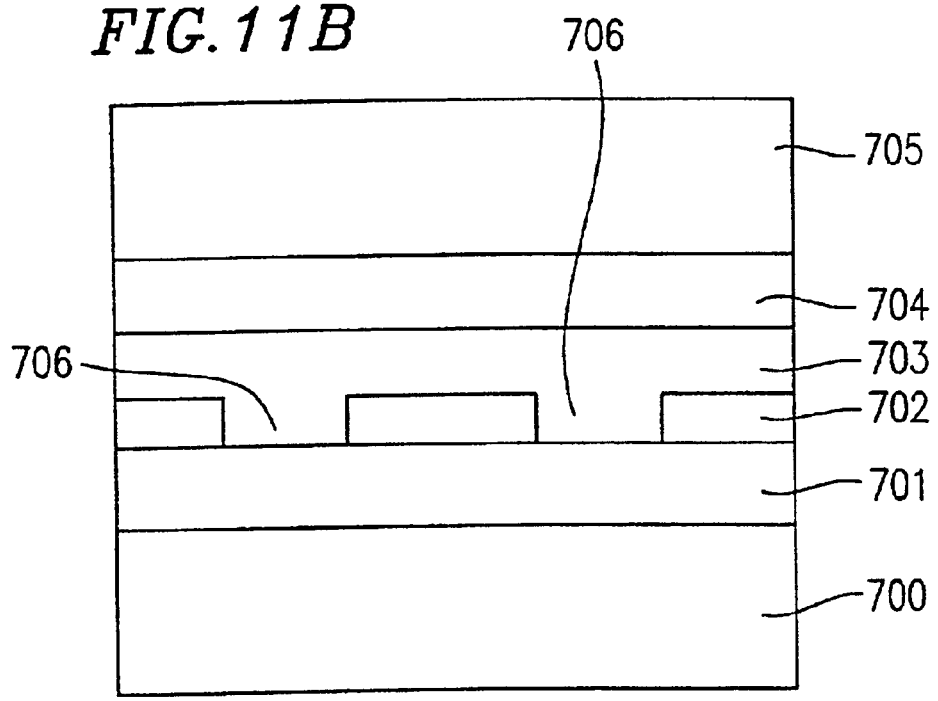

FIG. 11B is a cross-sectional view taken along a line a–a' in FIG. 11A. First, a sapphire substrate 700 having a C-plane is placed in an MOVPE growth chamber, and a GaN layer 701 is grown to a thickness of about 2 $\mu$m, using TMG and $NH_3$ as materials. Then, in order to form a first patterned mask, an $SiO_2$ film having a thickness of about 100 nm is formed by an EB vapor deposition method. Then, the $SiO_2$ film is patterned to a periodic stripe (width: about 3 $\mu$m; pitch: about 7 $\mu$m) by a conventional photolithography method, whereby a first mask pattern 702 is formed. As shown in FIG. 11A, The stripe direction of the first mask pattern 702 is prescribed to be <11-20> of a GaN crystal.

By using the substrate with the first mask pattern thus obtained, a first GaN film 703 is grown by a MOVPE method. More specifically, the first GaN film 703 is grown to a thickness of about 10 $\mu$m at a growth temperature of about 1050° C., using TMG and $NH_3$ as materials, in a predetermined growth chamber. Thus, the first step is completed. The first GaN film 703 starts growing from opening portions 706 of the first mask pattern 702, and is laterally grown in a direction horizontal to the substrate surface. Although a lateral growth speed is lower, compared with the case where the stripe direction of the mask pattern is prescribed to be <1-100> as in Embodiment 7 or 8, the GaN film 703 having a thickness of about 10 $\mu$m is grown flat, covering the first mask pattern 702.

A threading dislocation density of the first GaN film 703 is on the order of about $10^6/cm^2$ in the portions immediately above the first mask pattern 702. However, a threading dislocation density of the first GaN film 703 is on the order of about $10^7/cm^2$ in the portions immediately above the openings 706 of the first mask pattern 702. Compared with the case where the stripe direction of a mask pattern is prescribed to be <1-100>, a threading dislocation density in portions immediately above the mask pattern is larger by one to two orders of magnitude. Strains are relaxed in a direction vertical to the stripe of the mask pattern in the same way as in Embodiments 7 and 8.

Next, a second mask pattern 704 is formed on the first GaN film 703. More specifically, an $SiO_2$ film having a thickness of about 100 nm is formed by an EB vapor deposition method in the same way as in the first mask pattern 702. The $SiO_2$ film is patterned to a periodic stripe (width: about 5 $\mu$m; pitch: about 7 $\mu$m) by a conventional photolithography method, whereby a second mask pattern 704 is formed. As shown in FIG. 11A, the stripe direction of the second mask pattern 704 is prescribed to be <1-100>. Furthermore, the stripe width of the second mask pattern 704 is prescribed to be larger by about 2 $\mu$m than that of the first mask pattern 702.

Then, a second GaN film 705 is grown to a thickness of about 5 μm at a growth temperature of about 1050° C., using TMG and NH$_3$ as materials, in an MOVPE growth chamber. Thus, the second step is completed. The GaN film 705 is grown uniformly over the entire surface of the wafer.

A threading dislocation density of the entire second GaN film 705 is on the order of $10^5/\text{cm}^2$, which is slightly lower than that of the conventional example. The direction of strains (including thermal strains) caused in the first mask pattern 702 corresponds to the direction in which strains are relaxed in the second mask pattern 704. Similarly, the direction of strains caused in the second mask pattern 704 corresponds to the direction in which strains are relaxed in the first mask pattern 702. Thus, in Embodiment 9, there is a larger effect of removing strains, compared with Embodiments 7 and 8. Furthermore, as described above in Embodiment 9, only the first and second steps are conducted. However, a third step may be conducted: a third mask pattern can be formed on the second GaN film 705 so as to cover the portions which cannot be covered with the first and second mask patterns, and a third GaN film can be formed. This can reduce a threading dislocation density from on the order of $10^5/\text{cm}^2$ to a threading dislocation density on the order of $10^4/\text{cm}^2$.

In the present embodiment, the stripe directions of these mask patterns are not equivalent. Therefore, equivalent selectivity and an equivalent relaxation function as in Embodiment 7 cannot be expected. However, since the stripe directions of the mask patterns form an angle of about 90°, there is a large effect of strain relaxation.

Embodiment 10

Figure 12A:
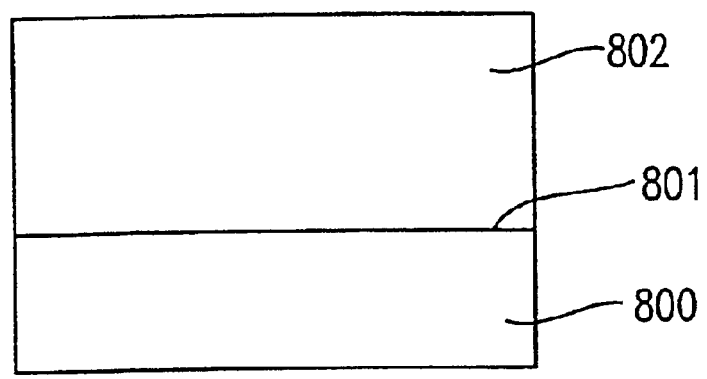
FIGS. 12A and 12B are views illustrating a semiconductor substrate in Embodiment 10 of the present invention.

The purpose of Embodiment 10 is to form a thick GaN film on a GaN film having a mask pattern with a growth suppressing effect. In the prior art, a GaN substrate, which has an appropriate size and satisfactory surface morphology intended for production of a nitride semiconductor device, has not been provided. Embodiment 10 provides a crack-free GaN substrate FIG. 12A is a cross-sectional view showing a structure of a nitride semiconductor including a thick GaN film produced in Embodiment 10. Reference numeral 800 denotes a nitride semiconductor (e.g., a GaN film) including a substrate produced by conducting n steps, using a method for forming a GaN film described in Embodiments 7 to 9, and an uppermost surface 801 of the nitride semiconductor 800 denotes the n-th nitride semiconductor film (e.g., a GaN film) produced during the n-th step. Reference numeral 802 denotes a thick GaN film produced by an HVPE method. The thick GaN film 802 may be produced by an MOVPE method, instead of the HVPE method. As shown in FIG. 12A, the nitride semiconductor structure is composed of the nitride semiconductor 800 including a substrate and the thick GaN film 802.

In Embodiment 10, the GaN film produced in Embodiment 7 will be exemplified as the nitride semiconductor 800 produced by n steps. The nitride semiconductor 800 including a sapphire substrate produced in Embodiment 7 is set in an HVPE apparatus. Then, in order to grow the thick GaN film 802, a V-group gas (which is a mixture of a NH$_3$ gas and a carrier H$_2$ gas) and a III-group gas (which is obtained by supplying an HCl gas onto Ga metal held in an HVPE apparatus at about 850° C. and mixing a III-group chloride (reaction product of Ga and an HCl gas with a carrier H$_2$ gas) are respectively supplied to an HVPE growth chamber in which the nitride semiconductor 800 is set. Thus, the thick GaN film 802 is grown to a thickness of about 350 μm. The thick GaN film 802 is grown flat, and observation of the surface thereof with an optical microscope shows that there are no cracks. Thus, a nitride semiconductor structure is formed.

A threading dislocation density of the thick GaN film 802 produced in Embodiment 10 is on the order of $10^3$ to $10^4/\text{cm}^2$ which is substantially the same or slightly lower than that of the GaN film which is the nitride semiconductor 800 produced in Embodiment 7. The same results as those in Embodiment 7 are obtained with respect to strains.

Figure 12B:
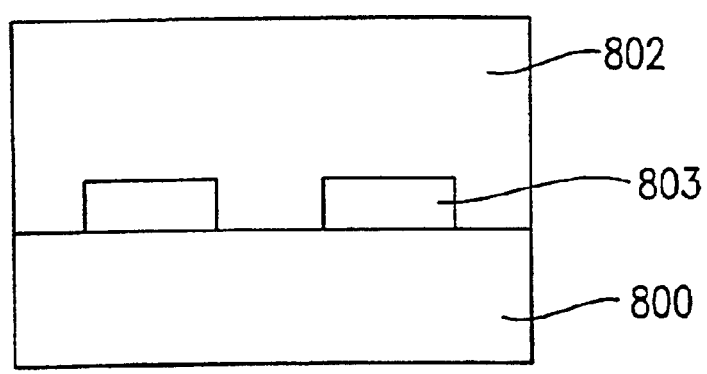

In Embodiment 10, the uppermost surface 801 of the nitride semiconductor (e.g., GaN film) 800 including a substrate produced during the n-th step is the n-th nitride semiconductor film (e.g., GaN film). However, as shown in FIG. 12B, the thick GaN film 802 may be formed directly on the n-th mask pattern 803. For example, in the case of using the nitride semiconductor 800 produced as in Embodiment 7, the thick GaN film is directly on the third mask pattern, and in the case of using the nitride semiconductor 800 produced as in Embodiment 8 or 9, the thick GaN film is directly on the second mask pattern. Characteristics of these crystals are the same as those in Embodiment 10.

A semiconductor structure including a sapphire substrate produced in Embodiment 10 can also be used as a substrate. Also, the sapphire substrate may be peeled off from the semiconductor structure by grinding or etching, or by utilizing thermal strains, and the remaining structure can be used as a GaN substrate. When such a GaN substrate is used, the thick GaN film 802 may be used as a substrate. Furthermore, a GaN substrate, which is obtained by removing the sapphire substrate and grinding or etching a part of the nitride semiconductor structure, may be used. For example, the n-th nitride semiconductor film which is the uppermost surface can be used as a substrate.

In the prior art, it is difficult to provide a nitride semiconductor substrate having an appropriate size and satisfactory surface morphology intended for device production. However, by removing at least the sapphire substrate from a crystal structure including a nitride semiconductor crystal layer, it becomes possible to provide a nitride semiconductor substrate which satisfies the requirements of device production by a simple procedure.

Furthermore, the crystal growth method including the above-mentioned steps has an effect of relaxing strains, in addition to decreasing a threading dislocation density. The strains are caused by a difference in a coefficient of thermal expansion as well as a difference in a lattice constant between the substrate and the nitride semiconductor crystal. For example, it is known that in the case where a thick nitride semiconductor is grown directly on a sapphire substrate, cracks (about 20 μm) are formed during a temperature decrease step at the end of crystal growth due to a difference in a coefficient of thermal expansion. However, by using the above-mentioned crystal growth method of the present invention, a thick nitride semiconductor film can be formed on a sapphire substrate without forming cracks.

Embodiment 11

Figure 13:
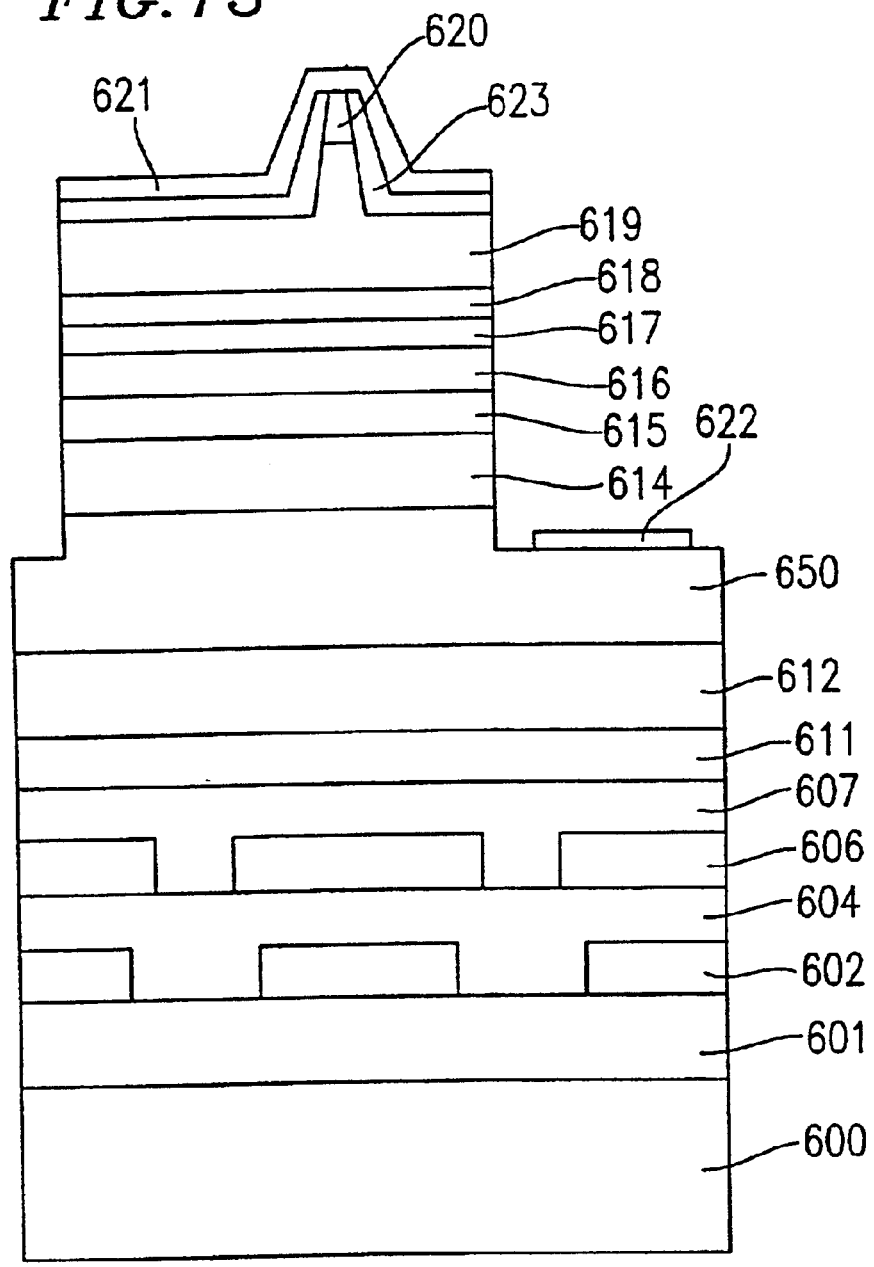
FIG. 13 is a cross-sectional view of a semiconductor laser device in Embodiment 11 of the present invention.
Figure 14:
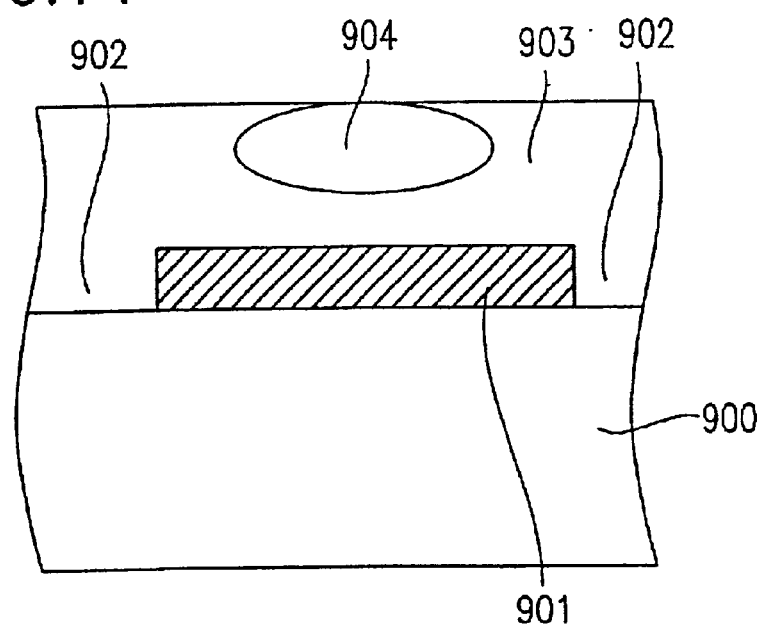
FIG. 14 is a cross-sectional view of a semiconductor substrate having a GaN crystal film on its surface in a first conventional example.
Figure 15:
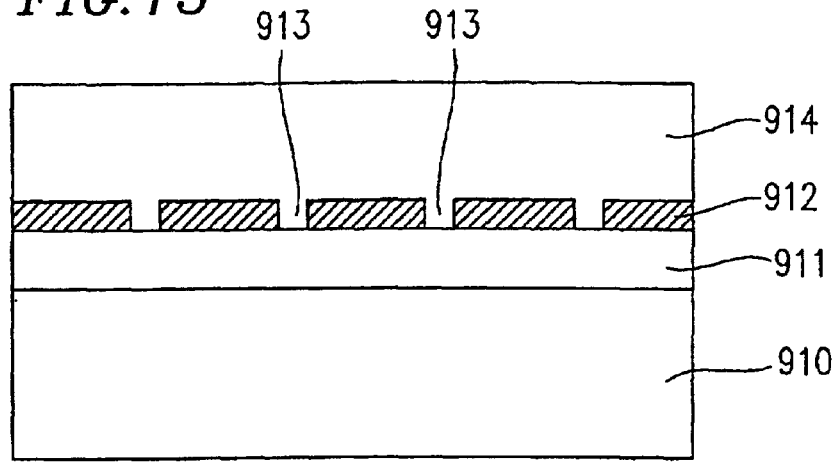
FIG. 15 is a cross-sectional view of a semiconductor substrate having a GaN crystal film on its surface in a second conventional example.

FIG. 13 shows a structure of a semiconductor laser device produced in Embodiment 11. The elements denoted by reference numerals 600 to 612 shown in FIG. 13 are the same as those in Embodiment 7.

The semiconductor laser device in the present embodiment includes an n-GaN contact layer 650, an Al$_{0.1}$Ga$_{0.9}$N cladding layer 614, an n-GaN optical guide layer 615, a multi quantum-well structure active layer 616 including 5 In$_{0.2}$Ga$_{0.8}$N quantum-well layers and 6 In$_{0.05}$Ga$_{0.95}$N barrier layers, an Al$_{0.2}$Ga$_{0.8}$N evaporation preventing layer 617, a p-GaN optical guide layer 618, a p-Al$_{0.1}$Ga$_{0.9}$N cladding layer 619, a p-GaN contact layer 620, a p-type electrode 621, an n-type electrode 622, and an SiO$_2$ insulating film 623.

According to the present invention, the surface of the sapphire substrate 600 may have another orientation, such as an a-plane, an r-plane, and an m-plane. Furthermore, a GaN substrate, an SiC substrate, a spinnel substrate, an MgO substrate, an Si substrate, and a GaAs substrate can be used in place of a sapphire substrate. Particularly in the case of using a GaN substrate, compared with the case of using a sapphire substrate, at least the following advantages are obtained: a difference in a lattice constant between the substrate and a gallium nitride type semiconductor material deposited on the substrate is smaller, and a film with satisfactory crystallinity can be obtained. Furthermore, the GaN substrate is more likely to be cleaved, so that it is easier to produce a laser resonator by cleavage. The cladding layers 614 and 619 maybe made of a mixed crystal containing three elements (AlGaN) having an Al mole fraction other than Al$_{0.1}$Ga$_{0.9}$N. In this case, when an Al mole fraction is increased, a difference in an energy gap and a difference in a refractive index between the active layer and the cladding layer becomes larger, so that carriers and light are confined in the active layer, which further decreases an oscillation threshold current and improves temperature characteristics. Furthermore, when an Al mole fraction is decreased to such a degree that carriers and light can be confined, the mobility of carriers in the cladding layer becomes large. Therefore, the resistance of a semiconductor laser device can be decreased. Furthermore, the cladding layers 614 and 619 may be made of a mixed crystal semiconductor containing a trace amount of another element in addition to the above-mentioned three elements, and the mole fractions of a mixed crystal are not required to be the same between the cladding layer 614 and the cladding layer 619.

The optical guide layers 615 and 618 may be made of any material which allows an energy gap therebetween to have a value between an energy gap of the quantum-well layers included in the active layer 616 and a energy gap of the cladding layers 614 and 619. For example, a mixed crystal containing three elements (e.g., InGaN or AlGaN) may be used. Furthermore, it is not necessary to dope a donor or an acceptor over the entire optical guide layers 615 and 618, and only a portion thereof on the side of the active layer 616 may be non-doped. Furthermore, the entire guide layers 615 and 618 may be non-doped. In this case, there is an advantage in that the number of carriers present in the optical guide layers 615 and 618 becomes small, light absorption by free carriers is decreased, and an oscillation threshold current can be further reduced.

With the quantum-well layers and the barrier layers included in the active layer 616, mole fractions should be set in accordance with a required laser oscillation wavelength. In the case where it is desirable to make an oscillation wavelength longer, the In mole fraction of the quantum-well layers is increased. In the case where it is desired to shorten an oscillation wavelength, the In mole fraction of the quantum-well layers is decreased. Furthermore, the quantum-well layers and the barrier layers may be made of a mixed crystal semiconductor containing four or more elements including a trace amount of another element in addition to a mixed crystal containing three elements (InGaN). The barrier layers may be made of GaN.

In the present embodiment, the evaporation preventing layer 617 is formed in contact with the active layer 616. The purpose of this is to prevent In contained in the active layer 616 from evaporating during an increase in growth temperature. Therefore, any material can be used for the evaporation preventing layer 617 as long as it protects the active layer 616. For example, a mixed crystal containing three elements (AlGaN) having another Al mole fraction and GaN may be used. Furthermore, Mg may be doped into the evaporation preventing layer 617. In this case, there is an advantage that holes can be easily injected from the optical guide layer 618 and the cladding layer 619. Furthermore, in the case where the In mole fraction of the quantum-well layers included in the active layer 616 is small, a change in the In mole fraction in the active layer 616 due to evaporation of In is small, so that the evaporation preventing layer 617 is not required to be formed. Even if the evaporation preventing layer 617 is not formed, characteristics of a gallium nitride type semiconductor laser device in the present embodiment will not be impaired.

Hereinafter, a method for producing the above-mentioned gallium nitride type semiconductor laser device will be described with reference to FIG. 13.

In the following description, the case of using a MOVPE method is shown. However, any method which is capable of epitaxially growing GaN may be used. For example, another crystal growth method such as MBE or HVPE can be used.

First, the contact layer 650 doped with Si is grown to a thickness of about 3 μm at a growth temperature of about 1050° C., using TMG, NH$_3$, and SiH$_4$ as materials, on the substrate produced in Embodiment 7 placed in a predetermined growth chamber. Then, TMA is added to the materials, and the cladding layer 614 doped with Si is grown to a thickness of about 0.4 μm at a growth temperature of about 1050° C. TMA is removed from the materials, and the optical guide layer 615 doped with Si is grown to a thickness of about 0.1 μm at a growth temperature of about 1050° C.

Next, the growth temperature is lowered to about 750° C., and 5 barrier layers (thickness: about 3 nm) and 5 quantum-well layers (thickness: about 2 nm) are alternately grown and the barrier layer (thickness: about 3 nm) is grown, using TMG, NH$_3$ and TMI, whereby the active layer 616 (total thickness: about 28 nm) is produced. Then, the evaporation preventing layer 617 is grown to a thickness of about 30 nm at a growth temperature of about 750° C., using TMG, TMA, and NH$_3$ as materials.

Next, the growth temperature is raised to about 1050° C., and the optical guide layer 618 doped with Mg is grown to a thickness of about 0.1 μm, using TMG, NH$_3$, and bisethylcyclopentadienyl magnesium (EtCP$_2$Mg) as materials. TMA is added to the materials, and the cladding layer 619 doped with Mg is grown to a thickness of about 0.4 μm at a growth temperature of about 1050° C. TMA is removed from the materials, and the contact layer 620 doped with Mg is grown to a thickness of about 0.5 μm at a growth temperature of about 1050° C. Thus, an epitaxial wafer having a gallium nitride type laser device structure is completed. Thereafter, the wafer is annealed in a nitrogen gas atmosphere at about 800° C., whereby the Mg-doped p-type layers are rendered low-resistant.

Furthermore, etching is conducted from the top surface of the contact layer 620 so as to obtain a stripe shape (width: about 200 μm) by using conventional photolithography and dry etching until the contact layer 650 is exposed, whereby a mesa structure is produced. Next, using the photolithography and dry etching similar to the above, the remaining contact layer 620 and the cladding layer 619 are etched. At this time, a stripe-shaped ridge structure should be positioned about 3 μm or more away from both ends of the mesa structure with a width of about 200 μm. In the present embodiment, the ridge structure is formed about 10 μm away from the end of the mesa structure on the side where the n-type electrode 622 is to be formed. If the ridge structure is positioned so as to be close to the n-type electrode 622 as described above, the electric resistance of a device is decreased, and the working voltage is reduced. Furthermore, the dry etching is stopped so as not to etch the active layer 616. Thus, the active layer 616 is protected from etching damage, which prevents a decrease in reliability and an increase in an oscillation threshold current.

The insulating film 623 is formed to a thickness of about 200 nm as a current blocking layer on the side surfaces of the ridge structure and on the surface of the p-type layer excluding the ridge. The p-type electrode 621 made of nickel and gold is formed on the surface of the insulating layer 623 and the contact layer 620, and the n-type electrode 622 made of titanium and aluminum is formed on the surface of the contact layer 650 exposed by etching. Thus, a gallium nitride type laser device wafer is completed.

Thereafter, the wafer thus obtained is cleaved in a direction vertical to the ridge stripe to form a resonance plane, and the wafer is divided into chips. Each chip is mounted on a stem, and each electrode is connected to each lead terminal by wire bonding. Thus, a gallium nitride type semiconductor laser device is completed.

In the semiconductor laser device produced as described above, satisfactory laser characteristics (oscillation wavelength: about 410 nm; oscillation threshold value: about 50 mA) are obtained. Furthermore, due to a decrease in crystal defects, the semiconductor laser device thus obtained is highly reliable (about 900 hours at about 60° C.). Furthermore, a ratio of laser devices having crystal defects is remarkably decreased, with a yield being about 80% or higher.

In the present embodiment, thicknesses of each quantum-well layer and each barrier layer included in the active layer 616 are about 2 nm and about 3 nm, respectively. However, as long as the thickness of each quantum-well layer and each barrier layer is prescribed to be about 10 nm or less, the same effects can be obtained irrespective of embodiments. Furthermore, the number of quantum-well layers in the active layer 616 may be 3 or 4. Alternatively, a single quantum-well structure active layer may be used.

In the present embodiment, sapphire, which is an insulator, is used for the substrate, so that the n-type electrode 622 is formed on the surface of the contact layer 650 exposed by etching. However, if GaN, SiC, Si, GaAs, or the like having an n-type conductivity is used, the n-type electrode 622 may be formed on the reverse surface of the substrate. In this case, the mesa structure with a width of about 200 $\mu$m should be positioned at least about 3 $\mu$m away from both ends of the semiconductor laser device chip. P-type structures and n-type structures may be reversed.

Furthermore, GaN used in the crystal growth method of the present invention can also be applied to a power device dealing with a large current (i.e., a device in the field of hard electronics such as a GaN FET device and an AlGaN/GaN HEMT device). In the case where a nitride semiconductor is applied to a power device, thermal strains caused by heat generation due to a large current are combined with strains present in the device, which has an adverse effect to reliability of the device. Therefore, in particular, the crystal growth method of the present invention is advantageous.

As described above, in a semiconductor substrate including a gallium nitride crystal layer produced according to the present invention, a film made of a growth suppressing material and a nitride semiconductor film are formed on different surfaces, using a reverse mask pattern, so that growth of a threading dislocation is prevented. Thus, a crystal having very small crystal defect density (about $10^4/cm^2$ or less) is obtained. A gallium nitride semiconductor laser device using such a crystal can be produced with highly reliability and good yield at a low production cost.

Alternatively, in a semiconductor substrate including a gallium nitride crystal layer produced according to the present invention, films made of a growth suppressing material and nitride semiconductor films are alternately formed. Thus, a crystal with little strains and a very small threading dislocation density (about $10^4/cm^2$ or less) is obtained. A gallium nitride semiconductor laser using such a crystal can also be produced with high reliability and good yield.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor substrate comprising:
   an n-th patterned mask containing a material having a growth suppressing effect, provided on or above a lower substrate, wherein n is an integer of 1 or more;
   an n-th nitride semiconductor crystal layer grown on or above the lower substrate via the n-th mask;
   an (n+1)-th patterned mask containing a material having a growth suppressing material substantially provided above an opening of the n-th patterned mask; and an (n+1)-th nitride semiconductor crystal layer grown on or above the lower substrate via the (n+1)-th patterned mask,
   wherein the n-th patterned mask and the (n+1)-th patterned mask are respectively patterned in a stripe shape, and a direction of the stripe of the n-th patterned mask is twisted from a direction of the stripe of the (n+1)-th patterned mask.

2. A light-emitting device produced by using the semiconductor substrate of claim 1.

3. A semiconductor substrate according to claim 1, wherein a width of the stripe of the (n+1)-th patterned mask is equal to or larger than a width of the stripe of the n-th patterned mask.

4. A semiconductor substrate according to claim 1, wherein the n-th nitride semiconductor crystal layer is made of AlGaN or InGaN.

5. A semiconductor substrate according to claim 1, wherein a stripe width of the second mask is smaller than each opening of the first mask.

6. A semiconductor substrate according to claim 1, wherein the n-th and (n+1)-th patterned masks are formed of the same material.

7. A semiconductor substrate according to claim 1, wherein the thickness of the n-th and (n+1)-th masks are the same as each other.

8. A semiconductor substrate according to claim 1, wherein the lower substrate is GaN.

9. A semiconductor substrate comprising:
   an n-th patterned mask containing a material having a growth suppressing effect, provided on or above a lower substrate, wherein n is an integer of 1 or more;
   an n-th nitride semiconductor crystal layer grown on or above the lower substrate via the n-th mask;
   an (n+1)-th patterned mask containing a material having a growth suppressing effect, provided so as to be at an angle of about 90° or 120° relative to the n-th patterned mask; and an (n+1)-th nitride semiconductor crystal layer grown on or above the lower substrate via the (n+1)-th patterned mask.

10. A semiconductor substrate according to claim 9, wherein a width of the stripe of the (n+1)-th patterned mask is equal to or larger than a width of the stripe of the n-th patterned mask.

11. A semiconductor substrate according to claim 9, wherein the n-th nitride semiconductor crystal layer is made of AlGaN or InGaN.

12. A semiconductor substrate according to claim 9, wherein a stripe width of the second mask is smaller than each opening of the first mask.

13. A semiconductor substrate according to claim 9, wherein the n-th and (n+1)-th patterned masks are formed of the same material.

14. A semiconductor substrate according to claim 9, wherein the thickness of the n-th and (n+1)-th masks are the same as each other.

15. A semiconductor substrate according to claim 9, wherein the lower substrate is GaN.

16. A semiconductor substrate comprising:

an n-th patterned mask containing a material having a growth suppressing effect, provided on or above a lower substrate, wherein n is an integer of 1 or more;

an n-th nitride semiconductor crystal layer grown on or above the lower substrate via the n-th mask;

an (n+1)-th patterned mask containing a material having a growth suppressing material substantially provided above an opening of the n-th patterned mask; and an (n+1)-th nitride semiconductor crystal layer grown on or above the lower substrate via the (n+1)-th patterned mask, wherein the first to (n+1)-th patterned masks are patterned in such a manner that a combination of the first to (n+1)-th patterned masks covers the entire surface of the lower substrate.

17. A light emitting device produced by using the semiconductor substrate of claim 16.

18. A light emitting device produced by using the semiconductor substrate of claim 16.

19. A semiconductor substrate according to claim 16, wherein a width of the stripe of the (n+1)-th patterned mask is equal to or larger than a width of the stripe of the n-th patterned mask.

20. A semiconductor substrate according to claim 16, wherein the n-th nitride semiconductor crystal layer is made of AlGaN or InGaN.

21. A semiconductor substrate according to claim 16, wherein a stripe width of the second mask is smaller than each opening of the first mask.

22. A semiconductor substrate according to claim 16, wherein the n-th and (n+1)-th patterned masks are fanned of the same material.

23. A semiconductor substrate according to claim 16, wherein the thickness of the n-th and (n+1)-th masks are the same as each other.

24. A semiconductor substrate according to claim 16, wherein the lower substrate is GaN.

25. A semiconductor substrate comprising:

an n-th patterned mask containing a material having a growth suppressing effect, provided on or above a lower substrate, wherein n is an integer of 1 or more;

an n-th nitride semiconductor crystal layer grown on or above the lower substrate via the n-th mask;

an (n+1)-th patterned mask containing a material having a growth suppressing effect, provided so as to be at an angle of about 90° or more relative to the n-th patterned mask; and an (n+1)-th nitride semiconductor crystal layer grown on or above the lower substrate via the (n+1)-th patterned mask.

* * * * *